United States Patent
Ohnakado et al.

(10) Patent No.: US 6,600,198 B2
(45) Date of Patent: Jul. 29, 2003

(54) ELECTROSTATIC DISCHARGE PROTECTION CIRCUIT FOR A SEMICONDUCTOR DEVICE

(75) Inventors: Takahiro Ohnakado, Hyogo (JP); Satoshi Yamakawa, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/946,492

(22) Filed: Sep. 6, 2001

(65) Prior Publication Data

US 2002/0146878 A1 Oct. 10, 2002

(30) Foreign Application Priority Data

Apr. 5, 2001 (JP) ........................................ 2001-106939

(51) Int. Cl.[7] .............................................. H01L 23/62
(52) U.S. Cl. ..................... 257/357; 257/355; 257/360
(58) Field of Search ................................ 257/355, 356, 257/357, 360; 361/101

(56) References Cited

U.S. PATENT DOCUMENTS

| | | | | |
|---|---|---|---|---|
| 5,255,146 A | * | 10/1993 | Miller | 361/56 |
| 5,272,097 A | * | 12/1993 | Shiota | 438/200 |
| 5,287,241 A | * | 2/1994 | Puar | 361/56 |
| 5,301,084 A | * | 4/1994 | Miller | 361/56 |
| 5,442,217 A | * | 8/1995 | Mimoto | 257/361 |
| 5,610,790 A | * | 3/1997 | Staab et al. | 361/56 |
| 5,811,857 A | * | 9/1998 | Assaderaghi et al. | 257/355 |
| 5,912,494 A | * | 6/1999 | Yu | 257/355 |
| 6,373,104 B1 | * | 4/2002 | Smith | 257/355 |
| 6,414,831 B1 | * | 7/2002 | Orchard-Webb | 361/111 |
| 6,426,244 B2 | * | 7/2002 | Hargrove et al. | 438/149 |
| 6,437,407 B1 | * | 8/2002 | Ker et al. | 257/357 |

FOREIGN PATENT DOCUMENTS

JP        4-4-49671        * 2/1992 .................. 257/357

OTHER PUBLICATIONS

Ker et al., Design on the Low–Leakage Diode STring for Using in the Power–Rail ESD Clamp Circuits in a 0.35 um Silicide CMOS Process, Apr. 2000, IEEE, Transactions on Solid–State Circuits, vol. 35, No. 4, pp. 601–611.*

Ming–Dou Ker et al.; "ESD Protection Design on Analog Pin with Very Low Input Capacitance for High–Frequency or Current–Mode Applications", *IEEE J. of Solid–State Circuits*, vol. 35, No. 8; pp. 1194–1199, Aug. 2000.

Ming–Dou Ker et al.; "Novel Octagonal Device Structure for Output Transistors in Deep–Submicron Low–Voltage CMOS Technology", *IEDM 96*, pp. 889–892.

* cited by examiner

*Primary Examiner*—George Eckert
(74) *Attorney, Agent, or Firm*—Leydig, Voit & Mayer, Ltd.

(57) ABSTRACT

A semiconductor device having high ESD resistance includes an internal circuit, an I/O pad, a division circuit connected to a lead-in line connecting the internal circuit and the I/O pad for outputting an electric signal from first and second terminals corresponding to an electric signal applied to the lead-in line and a clamp circuit including an MOS transistor for cutting off conduction when a difference in voltage between electric signals sent between the terminals is smaller in absolute value than a threshold voltage of the MOS transistor, and conducts when the absolute value is at least equal to the threshold voltage.

18 Claims, 33 Drawing Sheets

ELECTROSTATIC DISCHARGE PROTECTION CIRCUIT FOR A SEMICONDUCTOR DEVICE

BACKGROUND OF THE INVENTION

1. Field of the Invention

The present invention relates to a semiconductor device and a method of manufacturing the same, and particularly relates to a semiconductor device including a silicon MOSFET (Metal Oxide Semiconductor Field Effect Transistor) for a high frequency, which has high resistance against occurrence of surges such as a discharge phenomenon, as well as a method of manufacturing the same.

2. Description of the Background Art

As a result of widespread use of cellular phones and practical use of wireless LAN (Local Area Network) in recent years, attention has been focused on high-frequency semiconductor devices, which are essential for achieving high performance, small sizes and low costs of such electronic devices. In many cases, materials of these high-frequency semiconductor devices are III–V semiconductors such as GaAs having a high electron mobility. In recent years, however, the sizes of silicon MOS transistors have been remarkably reduced to allow production of MOS transistors having gate lengths shorter than 0.2 μm. The silicon MOS transistor having such a minute gate length can be applied to a high-frequency device in a gigahertz band because a trans-conductance Gm is remarkably improved and high-frequency characteristics are improved. However, the silicon MOS transistor having a gate length, which is reduced for use in a high-frequency device, has a lower resistance against a surge than conventional elements employing GaAs or the like. Therefore, it is necessary to take countermeasures against occurrence of surges such as electrostatic discharge.

Then, the countermeasures against disturbances such as electrostatic discharge will be described. When an electrostatically charged object comes into contact with another object, a discharge phenomenon may occur between these objects. This discharge phenomenon is called "ESD (ElectroStatic Discharge)". When ESD occurs in a semiconductor element, it may damage the semiconductor element. As typical models of the ESD, there are three models, i.e., (a) HBM (Human Body Model) which is a model of discharge from a charged human body to a semiconductor element, (b) MM (Machine Model) which is a model of discharge from a charged device to a semiconductor element and (c) CDM (Charge Device Model) which is a model of a phenomenon of discharge of electric charges carried on a semiconductor element itself to a grounded object. Among them, examples of current waveforms in (a) HBM and (c) CDM are shown in FIG. 59. It can be seen from FIG. 59 that a current stress of about 1 A occurs for a relatively long time of 100 ns in HBM, but a high current stress of about 10 A occurs for a very short time of 1 ns in CMD. In either of these models, a high current flows for a short time.

As described above, when ESD occurs, a high current is applied to the semiconductor element for a short time so that thermal destruction, i.e., melting by Joule heat, occurs. Further, insulation breakdown has occurred in some cases employing MOS transistor structures, which have been in the mainstream of LSI (Large-Scale Integration) silicon devices in recent years, because a high electric field due to ESD is applied to a gate oxide film of the MOS transistor. This insulation breakdown of the gate oxide film caused by ESD causes a significant obstacle to utilization of an inexpensive silicon semiconductor member. Countermeasures have been employed for avoiding the insulation breakdown of the gate oxide film. According to the countermeasures, an appropriate kind of protection circuit is formed between an I/O pin and an internal circuit so that a high-voltage surge caused upon occurrence of ESD may not reach the internal circuit. This protection circuit is called an ESD protection circuit. An object or target on a silicon wafer, which is connected to the foregoing I/O pin by wire bonding, is a pad. In the following description, therefore, a term "I/O pad" is used instead of "I/O pin".

In many cases, the ESD protection circuit is formed of a circuit, in which an MOS transistor in the off state is connected to an I/O signal line (M. -D. Ker et al., IEDM, pp. 889–892, 1996). FIG. 60 is a circuit diagram showing a semiconductor device, in which an MOS transistor in the off state is used as the ESD protection circuit. In FIG. 60, an n-channel MOS transistor 117n (which may be referred to as an "nMOS" hereinafter) and a p-channel MOS transistor 117p (which may be referred to as a "pMOS" hereinafter) are off. The nMOS has a drain D connected to an I/O signal line, and also have a gate G, a source S and a p-conductive well (which will be referred to as a "p-well" hereinafter) W, which are all grounded. The pMOS has a drain D connected to the I/O signal line, and also have a gate, a source and an n-well all connected to an external supply voltage, which will be referred to as "Vdd" hereinafter. Since two MOS transistors 117p and 117n are off, these transistors do not pass any current during an ordinary operation, and do not affect ordinary device operations.

When a high-voltage surge due to ESD is applied through the I/O pad, parasitic bipolar transistor effects occur in the pMOS and nMOS as described below so that a path for a high current flow from the drain to the source is formed. FIG. 61 shows the parasitic-bipolar transistor effect of the MOS transistor. In the following description, it is assumed that a surge of a positive voltage is applied to the drain of the nMOS. First, the positive voltage surge is applied to an $n^+$-type diffusion layer of drain D formed at a silicon substrate 101. When the voltage thus applied increases, breakdown occurs on a pn junction of the $n^+$-type diffusion layer, which is reversely biased, so that large amounts of electrons and holes are produced by impact ionization. These electrons flow to drain D bearing a positive voltage, and these holes flow to grounded p-well W.

It is assumed that the flow of holes to the p-well causes a current of a magnitude of $I_{hole}$, and the p-well has a resistance value of $R_{sub}$. A voltage drop of $I_{hole} \cdot R_{sub}$ occurs in the direction of depth of the p-well. This voltage drop causes a potential difference in the p-well so that the potential in the p-well region located at a shallow position immediately under the nMOS gate rises to a positive potential. In this operation, the $n^+$-type diffusion layer of the drain, the shallow p-well region immediately under the gate and the $n^+$-type diffusion layer of the source form an npn parasitic bipolar transistor. In this npn parasitic bipolar transistor, a reverse bias voltage is applied to a junction between the $n^+$-type diffusion layer of the drain and the shallow p-well region under the gate, and a positive bias voltage is applied to a junction between the shallow p-well region under the gate and the $n^+$-type diffusion layer of the source. By these voltages, the parasitic npn bipolar transistor is turned on.

In summary, when ESD occurs and a positive voltage is applied to the drain of the nMOS, which has a grounded gate and is off, the npn parasitic bipolar transistor is turned so that a large current can flow.

When a surge of a negative voltage is applied to the drain of the pMOS, effects similar to the above occur. Further, when a positive voltage is applied to the drain of the pMOS, the junction between the drain and n-well of the pMOS is subjected to a forward bias, and a current flows to the n-well. The on-operation in this case is usually expected in the pMOS. When a surge of a negative voltage is applied to a drain of the nMOS, a forward bias state is likewise attained and a current flows to the p-well similarly to the pMOS. The on-operation thus performed is also expected usually in the nMOS.

As described above, the ESD protection circuit using the MOS transistors in the off state can relieve a large current to the GND (ground) or Vdd when ESD occurs. As a result, it is possible to prevent flow of a large current in an internal circuit so that thermal destruction as well as insulation breakdown of the gate oxide film can be prevented.

For achieving the ESD protection function described above by the MOS transistor in the off state, it is necessary to keep a sufficiently large distance d between the gate electrode of each MOS transistor and the contact between the source and drain diffusion layers (FIG. 62). Distance d from the gate electrode to the contact between the source and drain diffusion layers must be in a range, e.g., from 5 μm to 6 μm according to the disclosure (M. -D. Ker et al., IEDM, pp. 889–892, 1996). It is stated that the purpose of increasing distance d is to increase the resistance and thereby avoid such a situation that the surge directly enters the gate to apply a stress to the gate.

Assuming that the contact has a diameter of c, the source/drain diffusion layer located between the gate electrodes has a width of 2d+c, as shown in FIG. 62. Therefore, the MOS transistor used for the ESD protection, which requires large distance d described above, has the source/drain diffusion layer of a large width. For example, according to the design rule of 0.2 μm, c is generally equal to 0.2 μm, and therefore the width (2d+c) of the source/drain diffusion layer takes a large value from 10.2 μm to 12.2 μm. Accordingly, the MOS transistor must have a gate width of 100 μm or more for achieving the sufficient ESD protection function. According to the 0.2 μm design rule, the parasitic capacitance of the source/drain diffusion layer per unit area, i.e., the depletion layer capacitance of the pn junction between the source/drain diffusion layer and the well, is equal to 1 fF/μm$^2$. Accordingly, it can be understood that the parasitic capacitance, which is formed between the source/drain diffusion layer of the MOS transistor used as the ESD protection element and the silicon substrate (well), takes the very large value from 1.02 pF to 1.22 pF.

As described above, the very large parasitic capacitance of the ESD protection element does not cause a problem in the semiconductor memory and logic device. However, the large parasitic capacitance causes a large problem in the high-frequency device employing the silicon MOS transistor. An impedance Z of a capacitance C has a magnitude of |Z| expressed by (1/(2π·f·C)). Therefore, the magnitude |Z| of the impedance of the capacitance C decreases as the frequency f increases for achieving a higher frequency. If capacitance C increases, the magnitude |Z| of impedance of capacitance C further decreases. More specifically, if a large capacitance C of the source/drain diffusion layer is connected to a high-frequency signal line, the impedance of the source/drain layer has an extremely small magnitude with respect to a high frequency. Further, a semi-insulating silicon substrate of high resistance, which has a high quality similar to that of a GaAs substrate, is not available, and therefore it is obliged to use a low-resistance substrate as the silicon substrate.

FIG. 63 shows a schematic equivalent circuit of the ESD protection circuit employing the MOS transistors formed on the above silicon substrate. Referring to FIG. 63, since the silicon substrate connected to the capacitance has a small resistance, a majority of the high-frequency signal flowing through the high-frequency signal line flows to the MOS transistors provided for the ESD protection. Accordingly, a majority of the high-frequency signal is lost due to the resistance of the silicon substrate:

As described above, if the silicon MOS transistors are used for forming the ESD protection element, it is very difficult to implement the high-frequency semiconductor device having high reliability with respect to the high-frequency signal. However, the protection against the ESD is necessary. Therefore, several kinds of countermeasures have been employed or proposed. These will now be described.

For protecting the internal circuit from the ESD surge applied to the I/O pad of the high-frequency signal, the protection must be effected, depending on the portion of the grounded surface, for such four cases that:

(A) an ESD surge of a positive voltage flows into the I/O pad for the high-frequency signal, and the grounded surface is a GND pin;

(B) an ESD surge of a positive voltage flows into the I/O pad for the high-frequency signal, and the grounded surface is a Vdd pin;

(C) an ESD surge of a negative voltage flows into the I/O pad for the high-frequency signal, and the grounded surface is a GND pin; and (D) an ESD surge of a negative voltage flows into the I/O pad for the high-frequency signal, and the grounded surface is a Vdd pin.

In the conventional ESD protection circuit described above, the surge flows to the grounded surface owing to the following operations, which correspond to the cases (A)–(D), respectively, so that the internal circuit is protected.

(A) The surge flows to the grounded surface (GND pin) owing to a parasitic bipolar effect induced by breakdown of the diffusion layer of the nMOS.

(B) The surge flows to the grounded surface (Vdd pin) owing to a diode forward operation of the diffusion layer of the pMOS.

(C) The surge flows to the grounded surface (GND pin) owing to a diode forward operation of the diffusion layer of the nMOS.

(D) The surge flows to the grounded surface (Vdd pin) owing to a parasitic bipolar effect induced by breakdown of the diffusion layer of the pMOS.

From the protection effects in the respective cases described above, it can be understood that the internal circuit is protected by utilizing both the breakdown, which is caused by the reverse voltage application, at the junction between the diffusion layer and the well of the MOS transistor as well as the forward operation.

However, it has been pointed out by M. -D. Ker et al., (IEEE J. Solid-State Circuits, vol. 35, No. 8, pp. 1194–1199, 2000) that the capability of ESD protection, which is performed when the operation causing the reverse breakdown at the junction of the diffusion layer, is significantly lower than the ESD protection capability in the forward operation.

Therefore, the manner of forming the following protection circuit for preventing an influence on characteristics of the high-frequency signal I/O pad has been known. Such a circuit is employed that pMOS and nMOS transistors 118*p* and 118*n* each having a large gate width are arranged between the Vdd and GND lines (FIG. 64). These gate widths are larger than those of the pMOS and nMOS transistors 117n and 117p connected to the high-frequency signal I/O pad. In this protection circuit, the following operations are performed for the respective cases described above.

(A) The surge is first passed to the Vdd line primarily by the diode forward operation of the diffusion layer of pMOS 117p. Then, the surge flows into pMOS 118p having the high gate width and the high ESD protection capability. In this pMOS 118p, the surge causes the breakdown of the diffusion layer, and the parasitic bipolar effect occurs so that pMOS 118p is turned on to form the flow path of the surge. Thereafter, the surge flows into nMOS 118n connected to pMOS 118p to cause the forward operation in nMOS 118n, and flows to the grounded surface (GND pin).

(B) The diode forward operation of the diffusion layer of pMOS 117p passes the surge to the grounded surface (Vdd pin).

(C) The diode forward operation of the diffusion layer of nMOS 117n passes the surge to the grounded surface (GND pin).

(D) The surge is first passed to the GND line primarily by the diode forward operation of the diffusion layer of nMOS 117n. Then, the surge flows into nMOS 118n having the high gate width and the high ESD protection capability. In this nMOS 118n, the surge causes the breakdown of the diffusion layer, and the parasitic bipolar effect occurs so that nMOS 118n is turned on to form the flow path of the surge. Thereafter, the surge flows into pMOS 118p connected to nMOS 118n to cause the forward operation in pMOS 118p, and flows to the grounded surface Vdd pin.

In the case of utilizing the ESD protection functions of MOS transistors 118p and 118n arranged between the Vdd and GND lines as described above, the breakdown operation may occur in these MOS transistors due to the reverse voltage application. Therefore, it is impossible to expect the good ESD protection characteristics in all the foregoing cases.

For overcoming the above problems, a manner of arranging a transient response clamp circuit 128 is arranged between the Vdd and GND lines as shown in FIG. 65 (M.-D. Ker et al., IEEE, J. Solid-State Circuits, vol. 35, No. 8, pp. 1194–1199, 2000). According to this circuit, the outflow of surge is achieved only by the diode forward operation in all the cases. Therefore, the ESD protection capability is improved, and it is possible to reduce significantly the gate width of MOS transistor in the ESD protection circuit connected to the high-frequency signal I/O pad. The arrangement of transient response clamp circuit 128 reduces a parasitic capacity added to the high-frequency signal I/O pad, and it is possible to avoid remarkable deterioration of the high-frequency characteristics, which may occur due to employment of the conventional ESD protection circuit.

The nMOSs forming the transient response clamp circuit described above is immediately turned on only in response to the ESD surge of a waveform having steep rising portions owing to an RC circuit structure. As a result, the ESD surge can flow from the Vdd line to the GND line, and vice versa. The transient response clamp circuit described above can clamp the voltages on the Vdd and GND lines with a low voltage, which does not cause the reverse breakdown of the MOS transistors connected to the high-frequency signal I/O pad. As a result, the ESD protection operation is achieved only by the diode forward operation in all the foregoing cases while keeping the small gate width and good high-frequency characteristics.

When the ESD surge does not flow, and a normal operation is performed, i.e., in the case where the Vdd voltage in a normal range is applied to the Vdd power supply pin, the waveform of Vdd voltage has slow rising portions so that the transient response clamp circuit 128 is not turned on. In the normal operation, therefore, a path between the Vdd and GND lines is cut off so that the transient response clamp circuit exerts no influence on the normal operation. As described above, the ESD protection circuit with the transient response clamp circuit, which can reduce the parasitic capacitance, is very useful as the ESD protection circuit for high-frequency signals.

However, the switching in the transient response clamp circuit 128 depends on only the rising steepness of the waveform of the signal applied to the Vdd line. This may result in a malfunction in the normal operation. The malfunction impairs the reliability of the high-frequency device, and therefore is not allowed. Accordingly, it has been demanded to provide an ESD protection circuit, which can completely eliminate the possibility of malfunction, and thus has high reliability.

SUMMARY OF THE INVENTION

An object of the invention is to provide a semiconductor device, which does not malfunction and has high ESD resistance against all the kinds of surges, as well as a method of manufacturing the same.

A semiconductor device according to the invention includes an internal circuit including a semiconductor element, an I/O pad forming a terminal of the internal circuit, a division circuit connected to a lead-in line connecting the internal circuit and the I/O pad, and outputting an electric signal from first and second terminals corresponding to an electric signal applied to the lead-in line and a clamp circuit formed of an MOS transistor arranged between the first and second terminals. The MOS transistor cuts off the conduction between the first terminal side and the second terminal side when a difference in voltage between the electric signal sent from the first terminal side and the electric signal sent from the second terminal side is smaller in absolute value than a threshold voltage of the MOS transistor, occurs the conduction when the absolute value of the voltage difference is equal to or larger than the threshold voltage, and thereby performs the clamping to prevent the voltage applied to the internal circuit from exceeding the predetermined value.

According to this structure, the protection circuit formed of the division circuit and the clamp circuit, which is formed of the MOS transistors, can outwardly pass the surge during a normal operation only when the surge is applied thereto. Therefore, the internal circuit can be protected without receiving any influence. Since the threshold voltage of the MOS transistor can correspond to the clamp voltage, an arbitrary voltage can be set as the clamp voltage depending on the magnitude of the signal voltage during the normal operation as well as a peak voltage of a surge, which is liable to occur, and others. The switching of the clamping function in accordance with the threshold voltage is performed not depending on the steepness of the surge, which is utilized in the prior art, but depending on the voltage value. Therefore, the accuracy is very high, and the high reliability as the protection circuit can be attained. The division circuit may be configured to prevent reverse bias, breakdown and others, whereby the protection circuit can deal with all kinds of surges, and can completely protect the internal circuit. However, in the division circuit described above, the transmission of the surge is not restricted to the transmission in the forward bias direction, and the surge may be transmitted in the reverse bias direction as a result of occurrence of the breakdown.

The clamp circuit described above may be formed of only the MOS transistor provided that the foregoing function can be achieved.

In the semiconductor device of the invention, the MOS transistor may be formed of an n-channel MOS transistor, a drain and a source of the n-channel MOS transistor may be connected to the first and second terminals, respectively, a gate and the drain of the n-channel MOS transistor may be connected together, and a p-conductive well and the source of the n-channel MOS transistor may be connected together. Likewise, the MOS transistor may be formed of a p-channel MOS transistor, a drain and a source of the p-channel MOS transistor may be connected to the first and second terminals, respectively, a gate and the source of the p-channel MOS transistor may be connected together, and an n-conductive well and the drain of the n-channel MOS transistor may be connected together.

By employing the foregoing connection of the nMOS or pMOS transistor forming the clamp circuit, the difference between the voltages applied to the drain and the source can be equal to a difference between the voltages applied to the gate and the channel. As a result, the clamp voltage, which is the potential difference applied between the opposite terminals (drain and source) of the clamp circuit, can be equal to the threshold voltage of the MOS transistor. As a result, the control based on the threshold voltage can be performed to discharge the voltage of the externally applied signal as the surge to the grounded surface without sending it to the internal circuit, or to send the voltage as the signal to the internal circuit.

In the semiconductor device of the invention, it is desired, for example, that the threshold voltage of the n-channel MOS transistor is higher than a voltage applied in a normal operation to an external power supply line connecting the division circuit and an external power supply. It is also desired that the threshold voltage of the p-channel MOS transistor is higher than a voltage applied in a normal operation to an external power supply line connecting the division circuit and an external power supply.

By setting the threshold voltage of the clamp circuit as described above, the voltage equal to or higher than the above threshold voltage can be externally passed as a surge without exerting no influence on the signal in the normal operation. Since the threshold voltage can be arbitrarily adjusted by changing the structure of the MOS transistor, it is very easy to determine a boundary between the signal voltage in the normal operation and the surge voltage.

In the semiconductor device of the invention, for example, the n-channel MOS transistor may have a gate formed of a p-conductive semiconductor. Further, the p-channel MOS transistor may have a gate formed of an n-conductive semiconductor.

According to this structure, a work function is large owing to different conductivities of the gate and the channel so that a high threshold voltage Vth can be achieved easily.

In the semiconductor device of the invention, for example, the division circuit is formed of a p-channel MOS transistor and an n-channel MOS transistor both connected to the lead-in line, the p-channel MOS transistor has a source and a drain, one being connected to the lead-in line and the other being connected to a gate, an n-conductive well and the first terminal, and the n-channel MOS transistor has a source and a drain, one being connected to the lead-in line and the other being connected to a gate, a p-conductive well and the second terminal.

According to the arrangement of the MOS transistors described above, diodes are equivalently arranged, and the division circuit can be formed of only the forward operations of the respective elements in the usual case. Further, the MOS transistor in the division circuit can have a reduced gate width so that the parasitic capacitance can be kept small. Accordingly, the impedance does not become extremely small, e.g., with respect to the high-frequency signal. As a result, such a situation can be avoided that the high-frequency signal is sent to the division circuit at the high priority. However, depending on the waveform of the surge, the position of application of the surge and others, such a case may occur that the surge is not outwardly transmitted only by the forward operations of the MOS transistors forming the division circuit, but is outwardly sent via the reverse operations.

In the semiconductor device of the invention, for example, both the gate widths of the p- and n-channel MOS transistors may be smaller than the gate width of the MOS transistor forming the clamp circuit.

According to this structure, both the two wells of the MOS transistors forming the division circuit can be small, and the capacitances thereof can be small. Therefore, the impedance of the division circuit cannot be extremely small even with respect to the high-frequency signal, and the high-frequency signal, which is lost through the division circuit, can be reduced.

In the semiconductor device of the invention, for example, the division circuit may be formed of two pn junction diodes both connected to the lead-in line and arranged to provide the forward direction directed from the second terminal to the first terminal.

As described above, by arranged the two pn junction diodes, the division circuit can be formed of only the elements performing the forward operations so that the internal circuit can be completely protected from surges in all cases.

In the semiconductor device of the invention, for example, the internal circuit may be a circuit including a silicon MOSFET (Metal Oxide Semiconductor Field Effect Transistor).

In the semiconductor device of the invention, the n-channel MOS transistor forming the clamp circuit may contain a p-conductive impurity in the channel portion at a concentration higher than that of an impurity in the channel portion of the MOS transistor included in the internal circuit. Also, the p-channel MOS transistor forming the clamp circuit may contain an n-conductive impurity in the channel portion at a concentration higher than that of an impurity in the channel portion of the MOS transistor included in the internal circuit.

By increasing the impurity concentration in the channel region, the inversion in the channel of the MOS transistor can be prevented until the gate voltage reaches a high value. Therefore, by adjusting the impurity concentration of the channel region, the threshold voltage can be accurately and easily increased. In the case where the division circuit is formed of the two MOS transistors, the impurity concentration of the channel portion of the MOS transistor in the clamp circuit may be determined based on the MOS transistor in the division circuit instead of the MOS transistor in the internal circuit, and may be higher than the impurity concentration of the channel portion of the MOS transistor in the division circuit.

According to the above structure, inexpensive silicone can be used to provide a semiconductor device having high ESD resistance such as a semiconductor device for high frequencies. The internal circuit described above may be a circuit for high frequencies, or may not be such a circuit.

In the semiconductor device of the invention, the MOS transistor forming the clamp circuit may have a gate insulating film thicker than a gate insulating film of at least one of silicon MOS transistors included in the internal circuit.

According to the above structure, the n-channel MOS transistor or the p-channel MOS transistor in the clamp circuit has the gate insulating film thicker than the gate insulating film of an ordinary MOS transistor, and thereby can have an increased threshold voltage. The on/off control of the channel is performed by the electric field immediately under the gate. As the thickness increases, it is necessary to increase the gate voltage for producing the same electric field. Since the thickness of the gate insulating film can be arbitrarily controlled, the threshold voltage can be arbitrarily set to a high level with good controllability. In the case where the division circuit is formed of the MOS transistor, the thickness of the gate insulating film of the MOS transistor in the clamp circuit may be determined based on the MOS transistor in the division circuit instead of the MOS transistor in the internal circuit, and may be larger than that of the gate insulating film of the MOS transistor in the division circuit.

In the semiconductor device of the invention, for example, the internal circuit may be a circuit for high frequencies.

According to the above structure, the division circuit having a reduced parasitic capacitance can be provided so that the impedance for the high-frequency signal may not be extremely small. Therefore, even if the internal circuit includes, e.g., a silicon semiconductor element, it is possible to provide the semiconductor device having high ESD resistance and good high-frequency characteristics. The internal circuit may include a silicon MOS transistor, or may not include a silicon MOS transistor. The internal circuit may contain or may not contain a semiconductor element of a III–V group compound such as GaAs.

In the semiconductor device of the invention, for example, the division circuit, clamp circuit and internal circuit may be formed on the common silicon substrate.

According to the above structure, it is possible to provide a semiconductor device, which has good surge resistance against all kinds of surges and, e.g., high-frequency characteristics as well as a compact and inexpensive structure.

A method of manufacturing a semiconductor device according to a first aspect of the invention is a method of manufacturing a semiconductor device for a high frequency provided with a protection circuit having a division circuit including MOS transistors of first and second conductivity types, and a clamp circuit formed of an MOS transistor of the first conductivity type. The manufacturing method includes the steps of forming wells of the MOS transistors of the first and second conductivity types of the division circuit as well as a well of the MOS transistor of the first conductivity type forming the clamp circuit in a silicon substrate by implanting impurities of the respective conductivity types; and additionally implanting the impurities of the first conductivity type into a channel portion at a surface portion of the well of the MOS transistor of the first conductivity type in the clamp circuit.

According to the above method, the impurity concentration of a channel region can be higher than a usual value, and thereby a threshold voltage corresponding to a boundary between the signal voltage in a normal operation and a surge can be set to a high value. Since the above impurities can be implanted with high accuracy, the threshold voltage can be set with high accuracy. The well can be formed at the same time as the formation of the well of the MOS transistor of the first conductivity type in the division circuit. Therefore, manufacturing steps can be simple.

A method of manufacturing a semiconductor device according to a second aspect of the invention is a method of manufacturing a semiconductor device for a high frequency provided with a protection circuit having a division circuit including MOS transistors of first and second conductivity types, and a clamp circuit formed of an MOS transistor of the first conductivity type. The manufacturing method includes the steps of implanting impurities of the first conductivity type into a source and a drain of the MOS transistor of the first conductivity type in the clamp circuit and the MOS transistor of the first conductivity type in the division circuit while covering a gate of the MOS transistor of the first conductivity type in the clamp circuit and the MOS transistor of the second conductivity type in the division circuit with a first resist pattern; and implanting impurities of the second conductivity type into the gate of the MOS transistor of the first conductivity type in the clamp circuit and the MOS transistor of the second conductivity type in the division circuit while covering the source and the drain of the MOS transistor of the first conductivity type in the clamp circuit and the MOS transistor of the first conductivity type in the division circuit with a second resist pattern.

By determining the second conductivity type as the conductivity type of the gate of the MOS transistor of the first conductivity type, it is possible to increase the threshold voltage owing to a difference in work function. In this case, the work function is variable depending on the impurity concentration so that the threshold voltage can be changed with high accuracy by controlling the impurity concentration. The step of implanting the impurities of the first conductivity type and the step of implanting the impurities of the second conductivity type may be performed in opposite sequence.

According to the method of manufacturing the semiconductor device of the second aspect of the invention, for example, the arrangement of the first resist pattern may be performed by arranging a simple resist pattern covering only the MOS transistor of the first conductivity type in the division circuit, and the step of implanting the impurities of the first conductivity type may be performed by implanting the impurities of the first conductivity type at a dose smaller than that in the step of implanting the impurities of the second conductivity type using the simple resist pattern.

According to the above structure, it is not necessary to provide the resist covering the gate of the MOS transistor in the clamp circuit. If the gate is provided with a side wall, LDD has a width nearly equal to the maximum thickness of the side wall, and can be smaller than that in the case where the foregoing resist is arranged. This is effective in reducing the parasitic capacitance, reducing the sizes, improving the operation speed and others.

A method of manufacturing a semiconductor device according to a third aspect of the invention is a method of manufacturing a semiconductor device for a high frequency provided with a protection circuit having a division circuit including MOS transistors of first and second conductivity types, and a clamp circuit formed of an MOS transistor of the first conductivity type. The manufacturing method includes the steps of implanting impurities of the second conductivity type while arranging a resist pattern covering the MOS transistor of the first conductivity type on a gate layer covering regions of the MOS transistors of the first and second conductivity types in the division circuit and a region of the MOS transistor of the first conductivity type in the clamp circuit; patterning the gate layer to form gate electrodes of the MOS transistors of the first and second conductivity types in the division circuit and the MOS transistor of the first conductivity type in the clamp circuit; and implanting impurities of the first conductivity type into the source and drain of the MOS transistor of the first conductivity type in the clamp circuit as well as the MOS transistor of the first conductivity type in the division circuit while arranging a resist pattern covering the MOS transistor of the second conductivity type and the gate of the MOS transistor of the first conductivity type in the clamp circuit.

According to the above structure, it is not necessary to form a resist pattern aimed at the gate of the MOS transistor of the clamp circuit, and the resist pattern can have a simple form.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the invention will now be described with reference to the drawings.

First Embodiment

Figure 1:
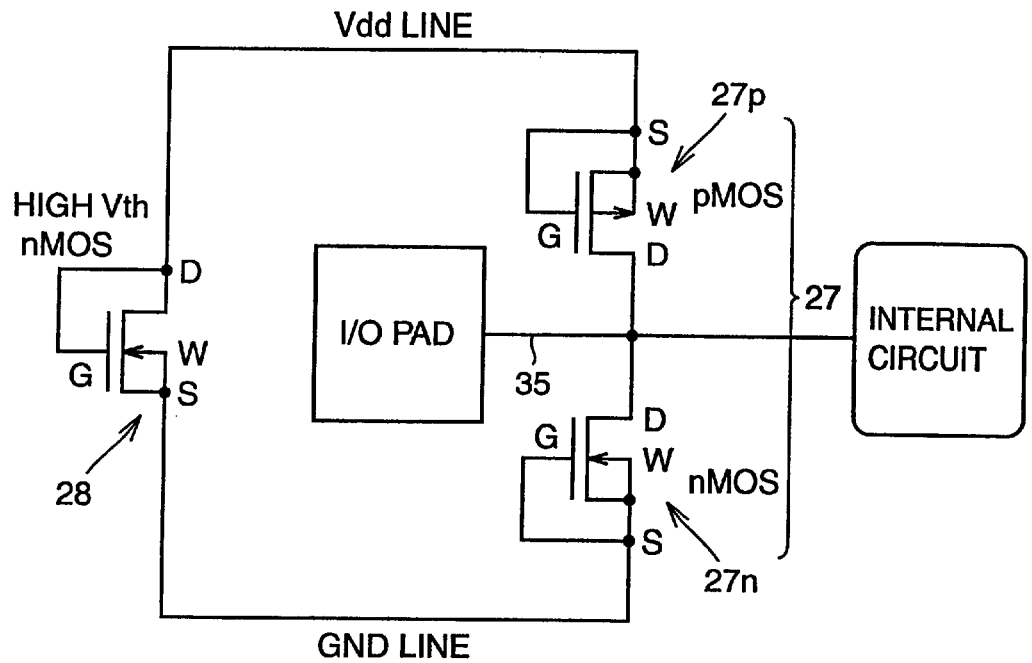
FIG. 1 is a circuit diagram showing a silicon MOSFET semiconductor device of a first embodiment of the invention.

In FIG. 1, an internal circuit is a high-frequency semiconductor device including silicon MOSFETs. A circuit 27 employing two MOS transistors in the off state is connected to a lead-in line 35 connecting a high-frequency signal I/O pad of this semiconductor device to the internal circuit. The gate widths of each of two MOS transistors 27p and 27n can be much smaller than the gate width of a MOS transistor of a conventional protection circuit. Therefore, a large capacitor is not needed in, contrast to an MOS transistor of a conventional division circuit, and impedance is not much smaller, even with respect to high-frequency signals. Accordingly, loss of the high-frequency signal can be reduced to a practically allowed level. The gate width of nMOS transistor 27n may be in a range from 5 to 100 μm, and the gate width of pMOS transistor 27p may be in a range from 5 to 200 μm. More specifically, the gate width of nMOS transistor 27n may be equal to 25 μm, and the gate width of pMOS transistor 27p may be equal to 50 μm. Circuit 27 described above is referred to as a "division circuit". Division circuit 27 has first and second terminals. The first terminal is connected to a Vdd line, which is connected to an external power supply. The second terminal is connected to a GND line.

In addition to this division circuit 27, an nMOS transistor 28 having a large gate width is arranged between the Vdd line and the GND line. nMOS transistor 28 has a threshold voltage Vth equal to or larger than a voltage value (Vdd) applied to the Vdd line. The gate width of nMOS transistor 28 having a high Vth can be in a range, e.g., from 100 μm to 10 mm and, more specifically, may be equal to 1 mm. MOS transistor 28 having large threshold voltage Vth is referred to as a "clamp element".

The protection operation of the silicon MOSFET semiconductor device in the foregoing four cases (A)–(D) will now be discussed.

Figure 2:
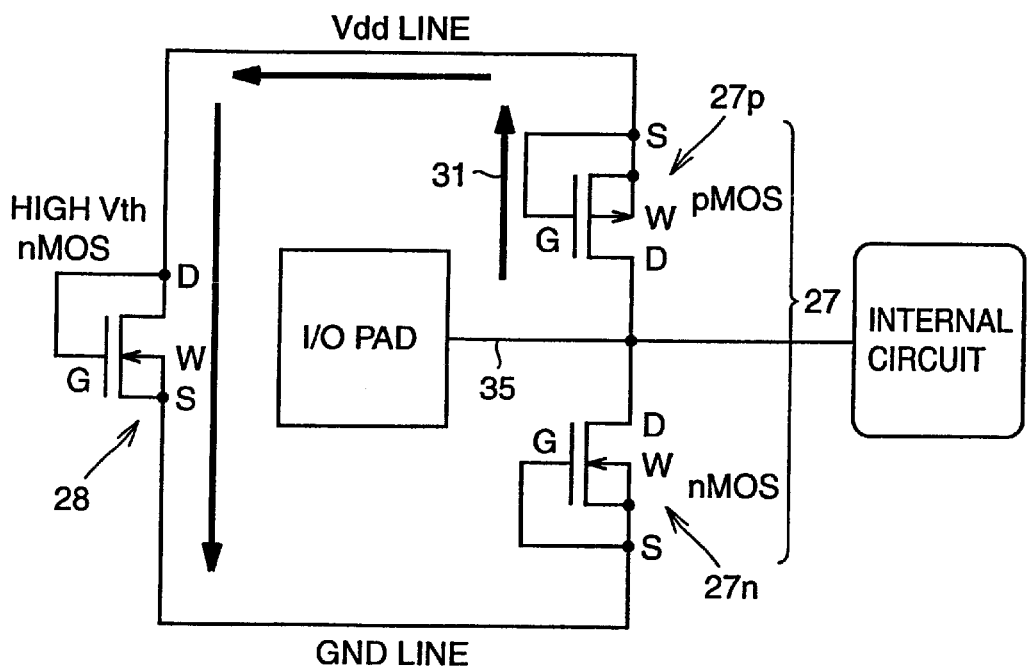
FIG. 2 shows a flow of a positive voltage surge applied into the silicon MOSFET semiconductor device shown in FIG. 1.
Figure 3:
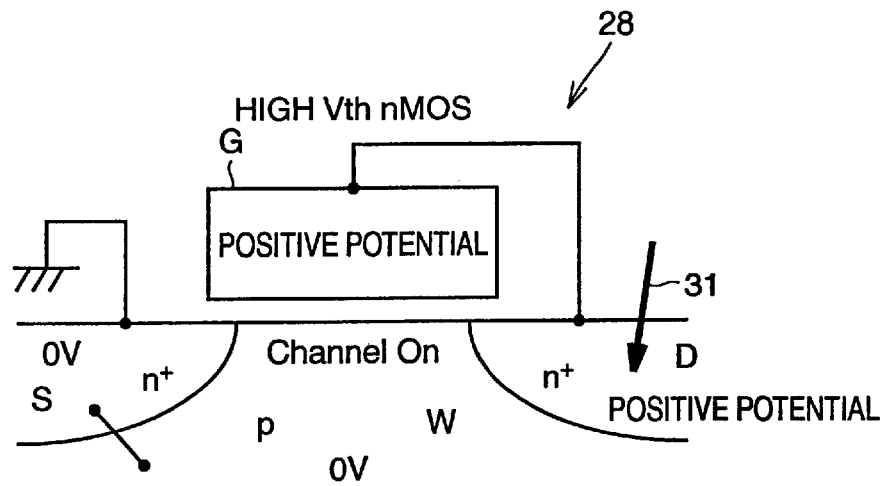
FIG. 3 is a cross section showing a flow of the positive voltage surge with a high Vth of a clamp element.

Case (A): As shown in FIGS. 2 and 3, a positive voltage surge applied to the high-frequency signal I/O pad first flows through Vdd line as a result of the diode forward operation of the diffusion layer of pMOS transistor 27p in division circuit 27. In nMOS transistor 28 having a high Vth, source S and p-well W are connected. However, in contrast to the conventional nMOS transistor in the off state for the ESD protection, gate G is not connected to source S and p-well W, and is connected to drain D. In the case (A) where the GND line is the grounded surface, therefore, source S and p-well W of nMOS transistor 28 of high Vth are grounded. In this state, positive voltage surge 31 flows into drain D and gate G to charge them positively.

If the voltage on the Vdd line exceeds threshold voltage Vth as a result of the above surge, the gate voltage exceeds threshold voltage Vth. Therefore, nMOS transistor 28 of the clamp element is turned on (a channel-on state in FIG. 3), and a current flows from the drain to the source through the channel. Thus, the Vdd line is electrically connected to the GND line, i.e., the grounded surface so that the ESD surge flows to the GND line, i.e., the grounded surface. As a result, the ESD protection operation is performed without causing the reverse breakdown in MOS transistors 27p and 27n forming the division circuit.

Cases (B) and (C): As described above, the ESD protection operation can be performed by the forward operation of MOS transistors 27n and 27p in division circuit 27 without utilizing nMOS transistor 28 of high Vth. Therefore, reverse breakdown occurs in neither MOS transistor 27n nor 27p.

Figure 4:
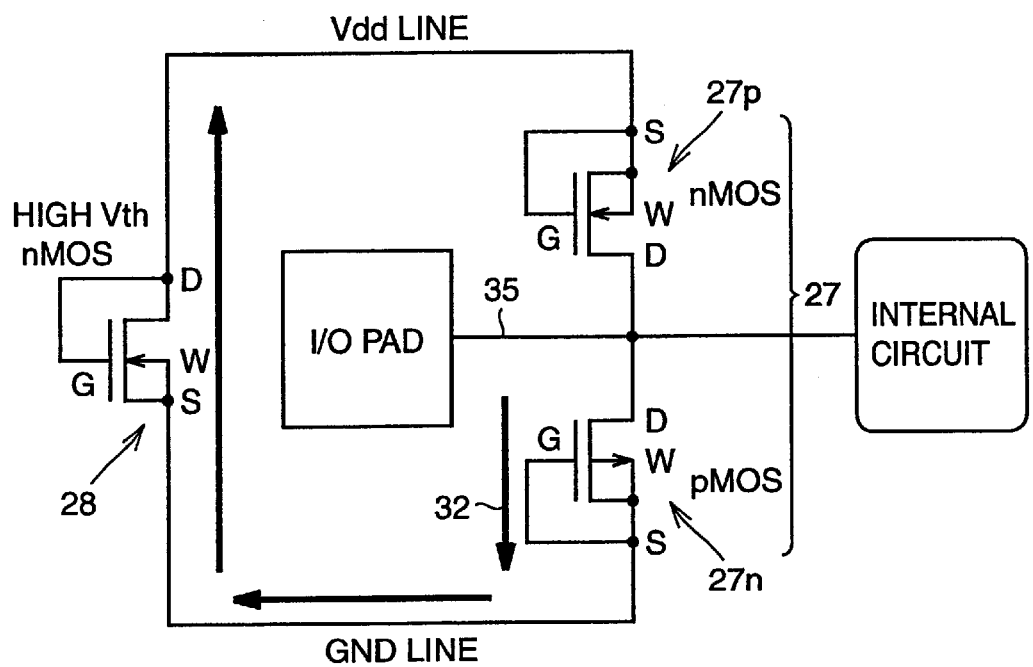
FIG. 4 shows a flow of a negative voltage surge applied into the silicon MOSFET semiconductor device shown in FIG. 1.
Figure 5:
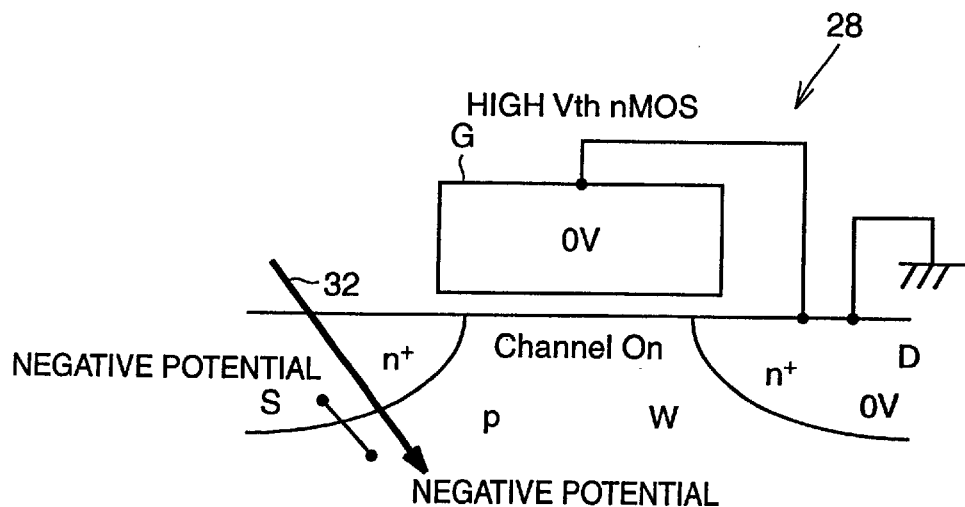
FIG. 5 is a cross section showing a flow of the negative voltage surge with a high Vth of a clamp element.

Case (D): As shown in FIGS. 4 and 5, a negative voltage surge 32 flowing into the high-frequency signal I/O pad flows to the GND line owing to the forward operation of nMOS transistor 27n, and flows into source S of nMOS transistor 28 of high Vth arranged between the Vdd line and GND line. In this case (D), the grounded surface is the Vdd line, and therefore drain D and gate G of nMOS transistor 28 of high Vth are grounded. Since source S and p-well W of nMOS transistor 28 of high Vth are connected, these are negatively charged by the negative voltage surge applied thereto.

When the absolute value of the charged voltage, i.e., the voltage on the GND line exceeds the threshold voltage Vth of nMOS transistor 28, nMOS transistor 28 of high Vth is turned on. In the on state, a current flows from the drain to the source through the channel. Thus, the GND line is electrically connected to the Vdd line forming the grounded surface, and the ESD surge flows to the Vdd line, i.e., the grounded surface. In this case, the ESD protection operation can be performed without causing the reverse breakdown in MOS transistors 27p and 27n of the division circuit.

According to the above structure, the ESD protection operation can be achieved without causing the reverse breakdown in MOS transistors 27p and 27n of division circuit 27 in all the cases (A)–(D) where the surge is applied. Therefore, it is possible to reduce the gate width of the MOS transistors in division circuit 27 connected to the high-frequency signal I/O pad. Therefore, high ESD resistance can be achieved while reducing the parasitic capacitance and avoiding deterioration of high-frequency characteristics. Since clamp element 28 between the Vdd line and the GND line is a voltage clamp circuit, a malfunction does not occur in contrast to a transient response type, and therefore it is possible to achieve the device having high reliability.

In the normal operation, source S and p-well W of nMOS transistor 28 of high Vth are grounded, and the voltage on the Vdd line is applied to drain D and gate electrode G. In the case where a general MOS transistor were arranged between the Vdd line and the GND line, the general MOS transistor would be fully turned on under the foregoing voltage conditions, and the Vdd line and the GND line would be short-circuited so that the device would not operate correctly. However, nMOS transistor 28 has threshold voltage Vth higher than Vdd achieved in the normal operation. Therefore, in the normal operation, the potential difference between the gate electrode and the p-well is equal to or smaller than Vth. In the normal operation, therefore, the nMOS transistor of high Vth maintains the off state, and does not affect the normal operation of the device.

According to the invention, as described above, the voltage applied across the Vdd line and the GND line can be clamped at an intended voltage without affecting the normal operation and causing a malfunction. Therefore, it is possible to provide a high-frequency semiconductor device, which has high ESD resistance, high reliability and uses the silicon MOS transistors. Further, by reducing the gate widths of the two MOS transistors in the division circuit, it is possible to reduce the parasitic capacitance and avoid the deterioration of the high-frequency characteristics.

Depending on the waveform of the surge and the position where the surge is applied, such a surge may occur that is transmitted by the reverse operation as a result of occurrence of the breakdown. Even in this case, the normal operation is not affected at all, and the clamp element can protect the internal circuit from the surge when occurred. The case, where the surge is transmitted by the reverse operation as a result of the breakdown, also occurs in the embodiments, which will be described below.

Second Embodiment

Figure 6:
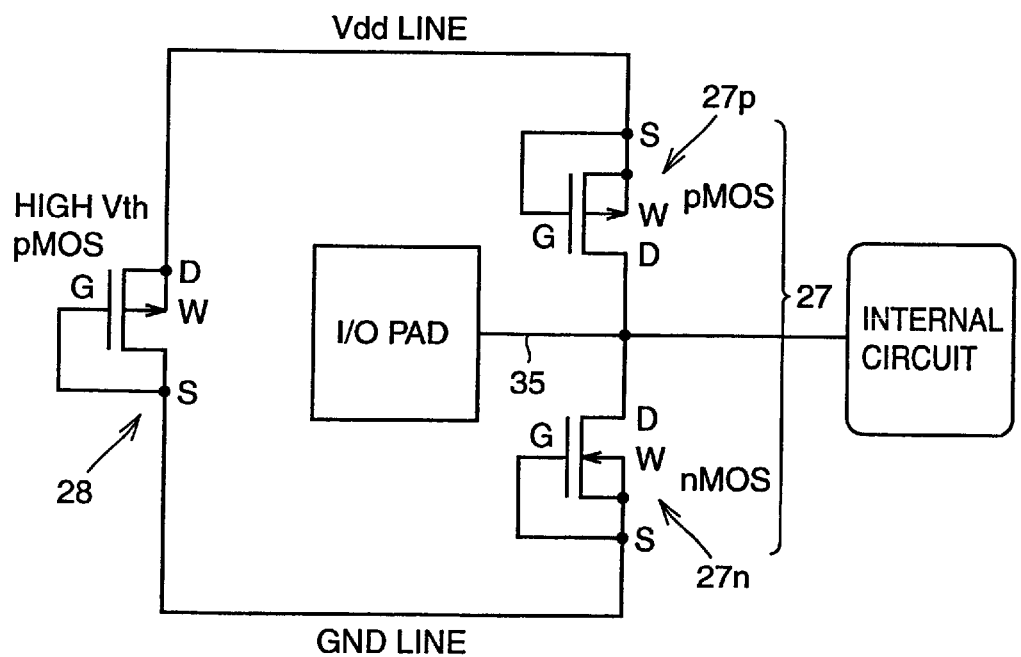
FIG. 6 is a circuit diagram of a silicon MOSFET semiconductor device of a second embodiment of the invention.

A second embodiment of the invention differs from the first embodiment in that MOS transistor 28 of the clamp element is formed of a pMOS. Structures other than the above are the same as those in the first embodiment. In pMOS transistor 28 of high Vth shown in FIG. 6, drain D and n-well W are connected together, and gate G is not connected to drain D and n-well W, but is connected to source S.

In the case where clamp element 28 employs the pMOS transistor of high Vth, the protection operation is performed in the same manner as the case employing the nMOS transistor, and the same effect can be achieved.

For example, nMOS transistor 27n arranged in the high-frequency signal I/O pad has the gate width of 5–100 μm, and pMOS transistor has the gate width of 5–200 μm. Further, pMOS transistor arranged in clamp circuit 28 may have the gate width of, e.g., 100 μm–10 mm.

In this embodiment, the voltage across the Vdd line and the GND line can be clamped at an intended low voltage when the ESD surge is applied. Therefore, the ESD protection operation can be performed by the forward operation in all the cases without causing the reverse breakdown of the MOS transistors in division circuit 27. Thereby, high ESD resistance can be ensured without causing a malfunction, and deterioration of high-frequency characteristics can be avoided owing to reduction in parasitic capacitance.

Third Embodiment

FIGS. 7–22 show a method of manufacturing a silicon MOSFET semiconductor device of a third embodiment of the invention. The silicon MOSFET semiconductor device of the third embodiment has the nMOS transistor of high Vth, in which the concentration of p-type impurities in the channel portion is higher than the concentration of p-type impurities in the p-well. In this embodiment, the high p-type impurity concentration of the channel of nMOS transistor 28 of high Vth is achieved by additionally implementing p-type ions. In connection with the following description of manufacturing steps, regions such as drains, channels and wells are not shown in the figure.

Figure 7:
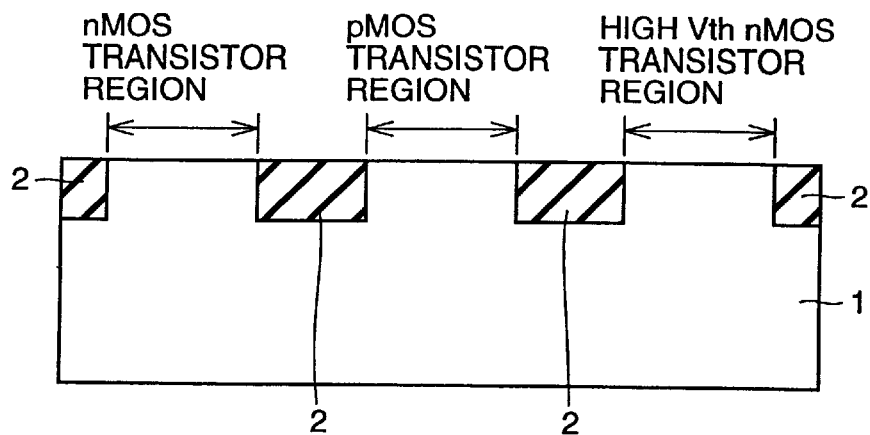
FIG. 7 is a cross section showing a stage for manufacturing a protection circuit portion of a silicon MOSFET semiconductor device of a third embodiment of the invention, and particularly a stage in which an isolation film is formed at a silicon substrate.
Figure 8:
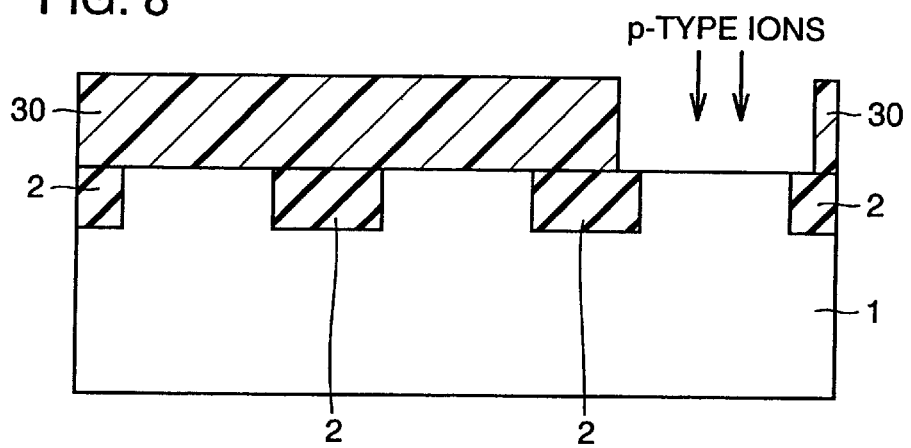
FIG. 8 is a cross section showing a stage in which a resist is arranged and p-type ions are additionally implanted into an nMOS channel region of a high Vth.

First, isolating oxide films 2 for trench isolation, LOCOS isolation or the like are formed at silicon substrate 1, and then wells are formed (FIG. 7). Using resist 30, p-type ions are then additionally implanted into the channel region (p-well surface side) of nMOS transistor of high Vth (FIG. 8). By this addition of the p-type ions to the channel region, high threshold voltage Vth can be ensured.

Figure 9:
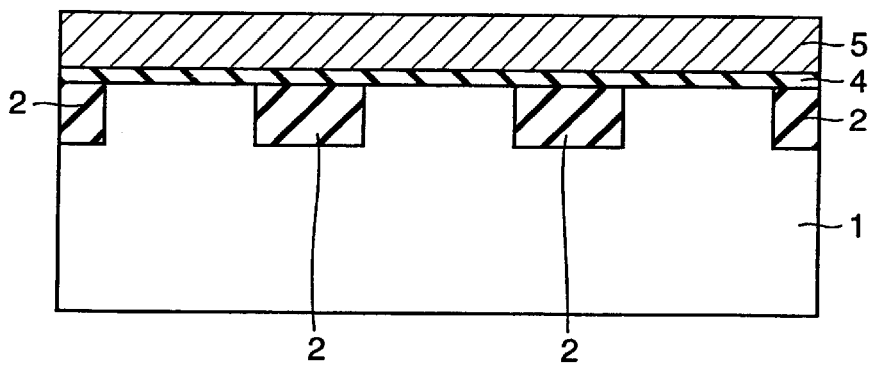
FIG. 9 is a cross section showing a stage in which the resist is removed, and a gate insulating film and a gate layer are formed.
Figure 10:
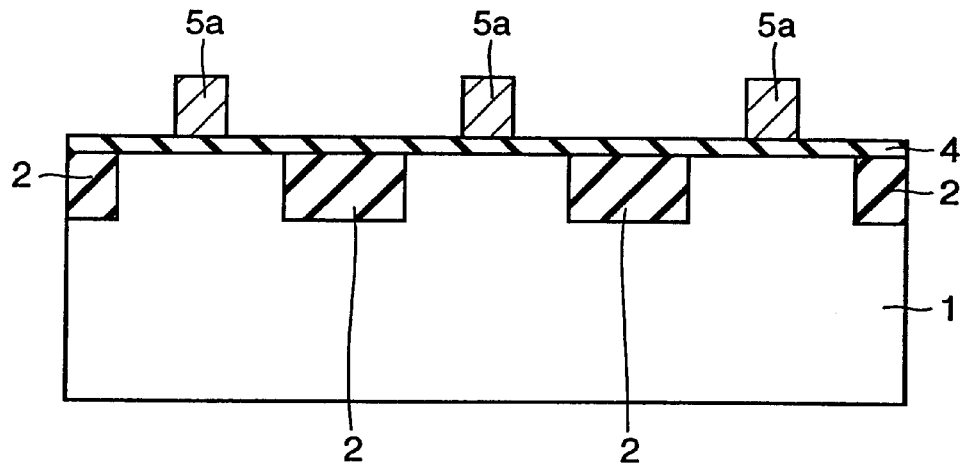
FIG. 10 is a cross section showing a stage in which gate electrodes are formed by patterning the gate layer.
Figure 11:
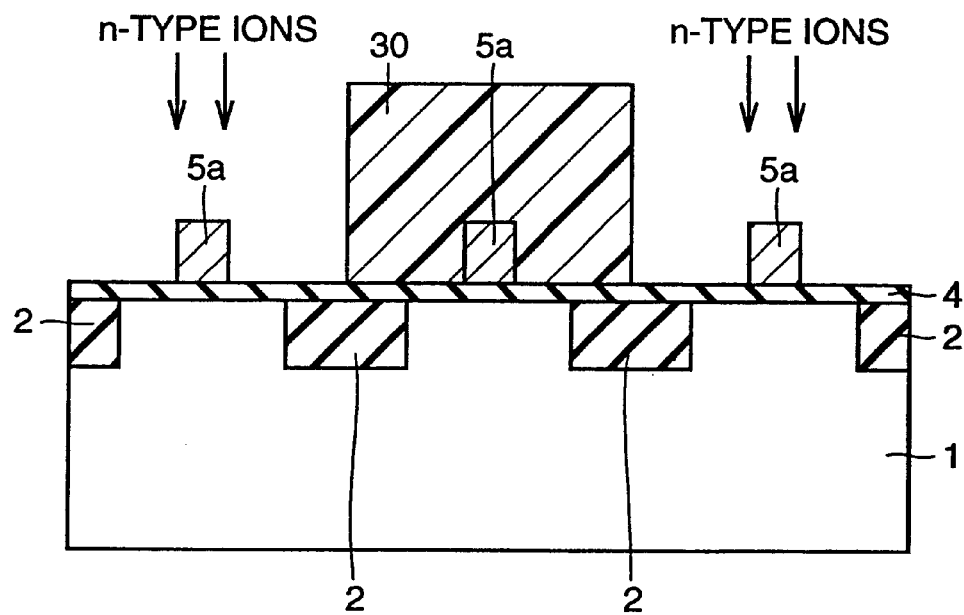
FIG. 11 is a cross section showing a stage in which a resist is arranged, and n-type ions are implanted into an nMOS to form an n⁻-type region of LDD.
Figure 12:
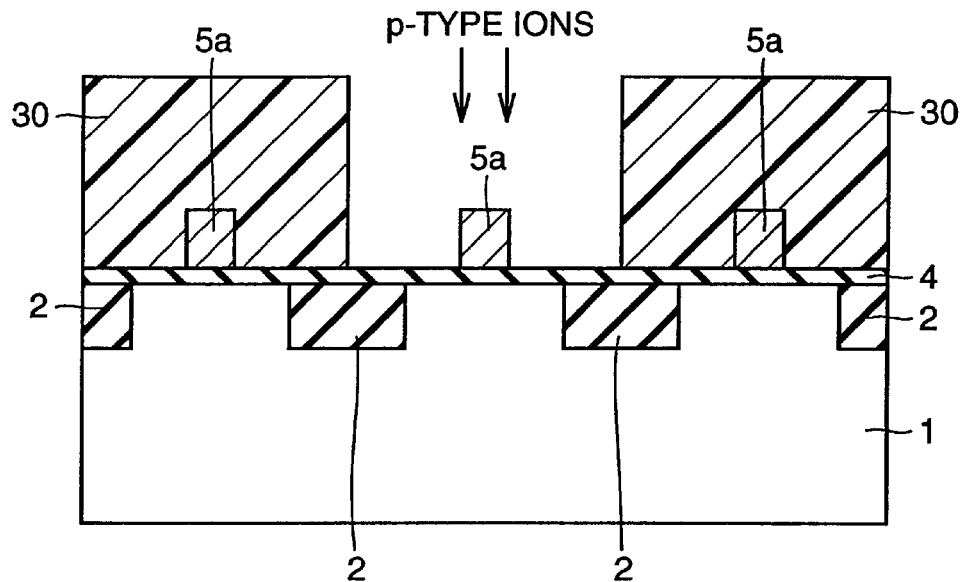
FIG. 12 is a cross section showing a stage in which p-type ions are implanted into a pMOS to form a p⁻-type region of LDD.
Figure 13:
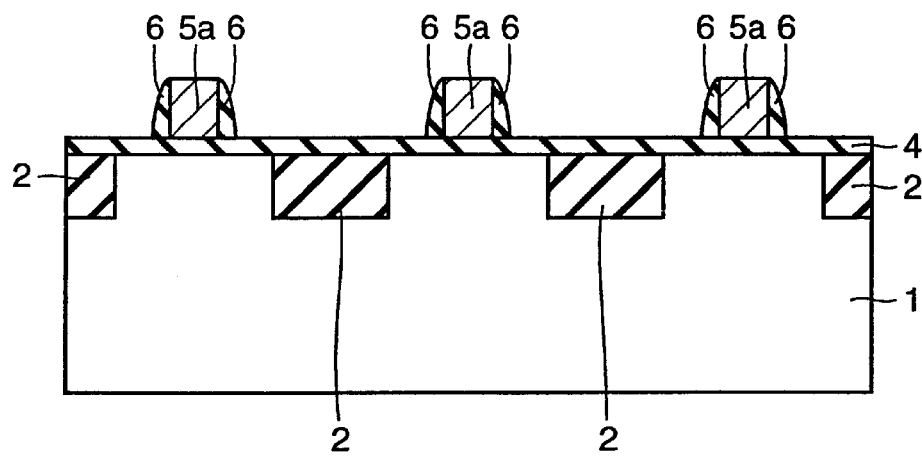
FIG. 13 is a cross section showing a stage in which a sidewall is formed on a side surface of each gate electrode.

After this, a gate insulating film 4 such as an oxide film or a nitride film is deposited, and a polycrystalline silicon film 5, which is not doped with impurities and will form gate electrodes, is formed on gate insulating film 4 (FIG. 9). Then, polycrystalline silicon film 5 is patterned to form gate electrodes 5a (FIG. 10). Thereafter, resist 30 is arranged on a region of pMOS, and n-type ions are implanted into the source and drain regions of nMOS so that n$^-$-type regions (not shown) of LDD (Lightly Doped Domain) are formed (FIG. 11). Further, resist 30 is arranged on the region of nMOS, and p-type ions are implanted into the source and drain regions of pMOS so that p$^-$-type regions (not shown) of LDD are formed (FIG. 12). Then, a sidewall 6, which is formed of an oxide film, a nitride film or a combination of them, is formed on each side surface of gate electrode 5a (FIG. 13).

Figure 14:
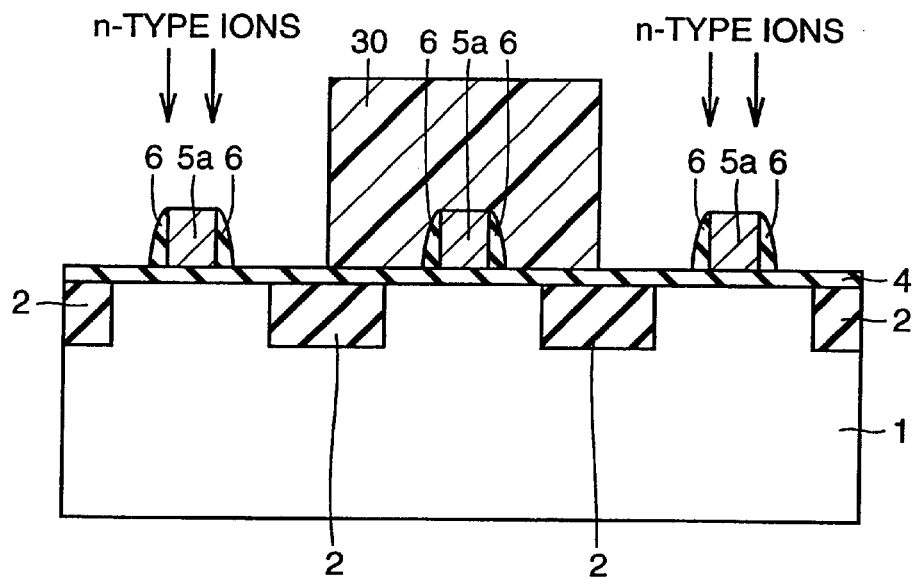
FIG. 14 is a cross section showing a stage in which n-type ions are implanted into a source and a drain of the nMOS.
Figure 15:
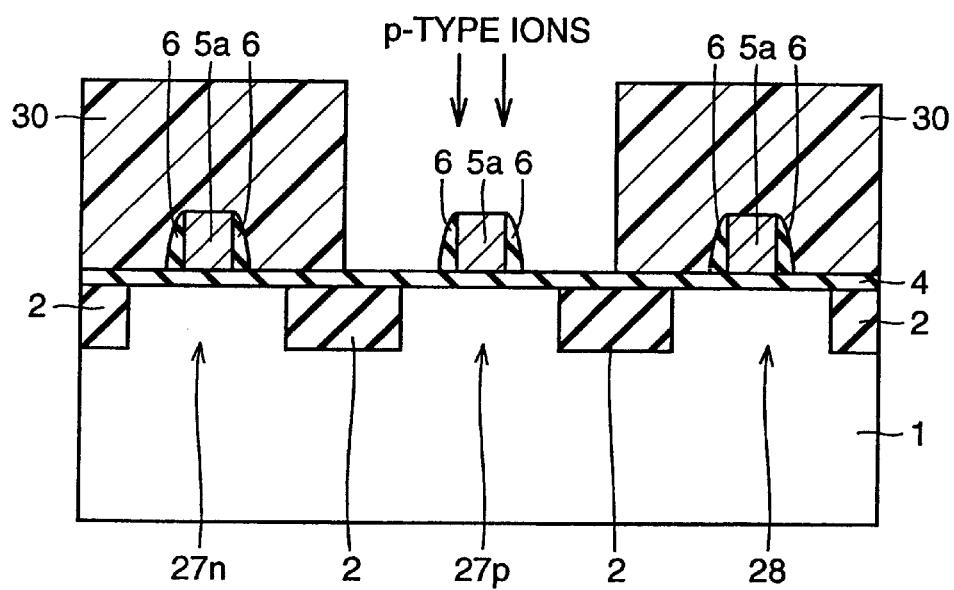
FIG. 15 is a cross section showing a stage in which p-type ions are implanted into a source and a drain of the pMOS.
Figure 16:
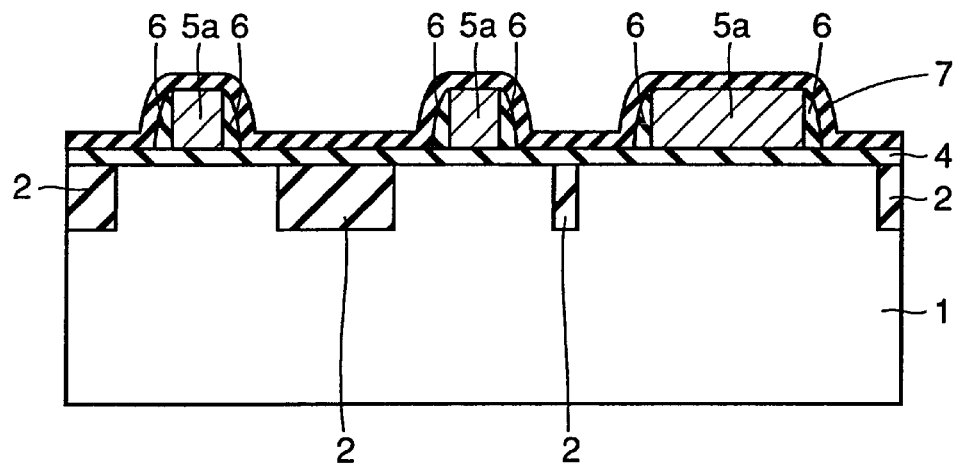
FIG. 16 is a cross section showing a stage in which an insulating film for preventing silicide is deposited.

After arranging a resist on a region of pMOS, n-type ions are implanted into the source and drain of nMOS to form n$^+$-type regions (not shown) (FIG. 14). At this time, n-type ions are implanted into the gate of nMOS transistor 28 of high Vth and the gate of another nMOS transistor 27n so that structures of the n-conductive type are formed. Thereafter, a resist is arranged on the region of nMOS, and p-type ions are implanted into the source and drain regions of the pMOS to form the p$^+$-type regions (FIG. 15).

Figure 17:
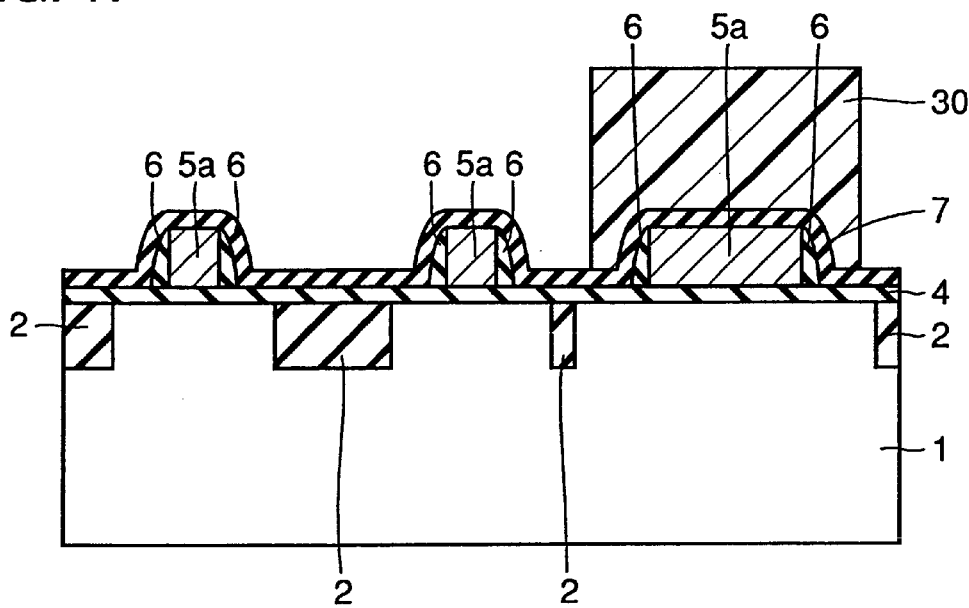
FIG. 17 is a cross section showing a stage in which a resist is arranged on an nMOS region of a high Vth.
Figure 18:
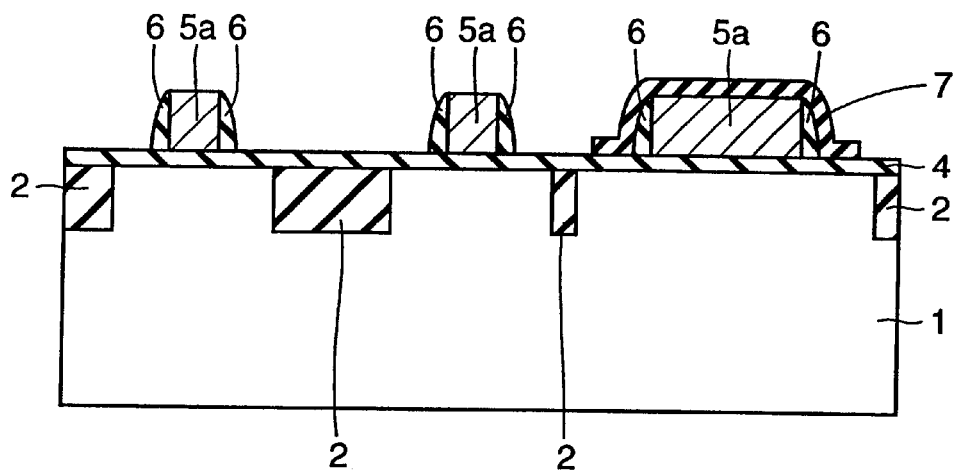
FIG. 18 is a cross section showing a stage in which the insulating film for preventing silicide is removed by etching using a resist as a mask.
Figure 19:
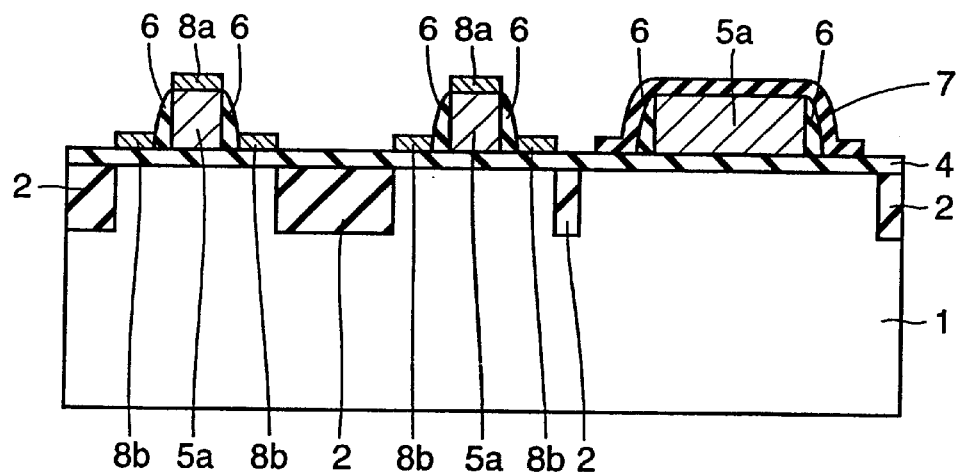
FIG. 19 is a cross section showing a stage in which a silicide film is deposited, and electrodes of the pMOS and nMOS in the division circuit are formed.
Figure 20:
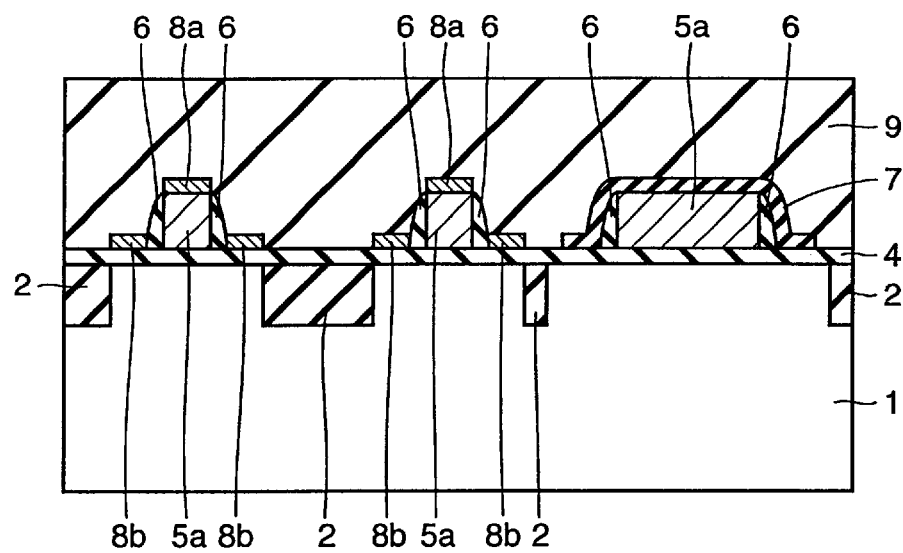
FIG. 20 is a cross section showing a stage in which an interlayer insulating film is deposited.
Figure 21:
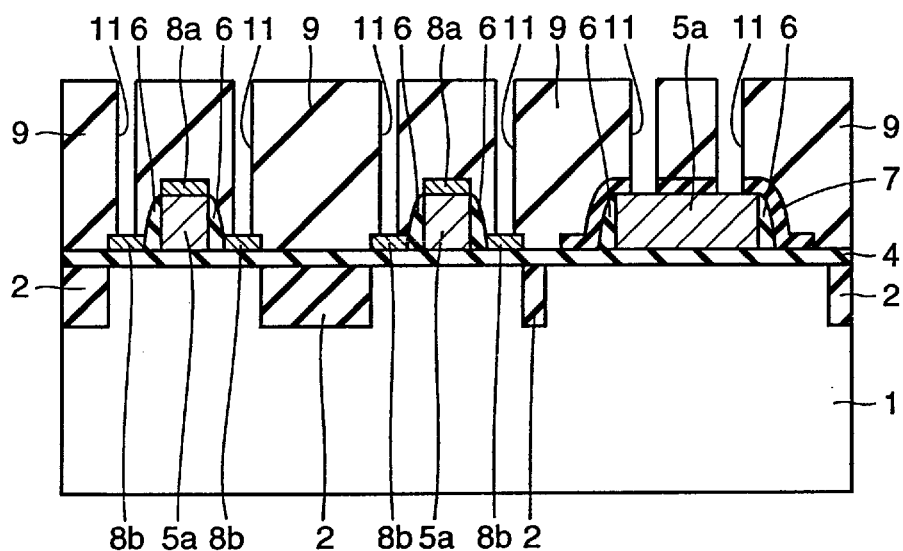
FIG. 21 is a cross section showing a stage in which contact holes are formed in the interlayer insulating film.
Figure 22:
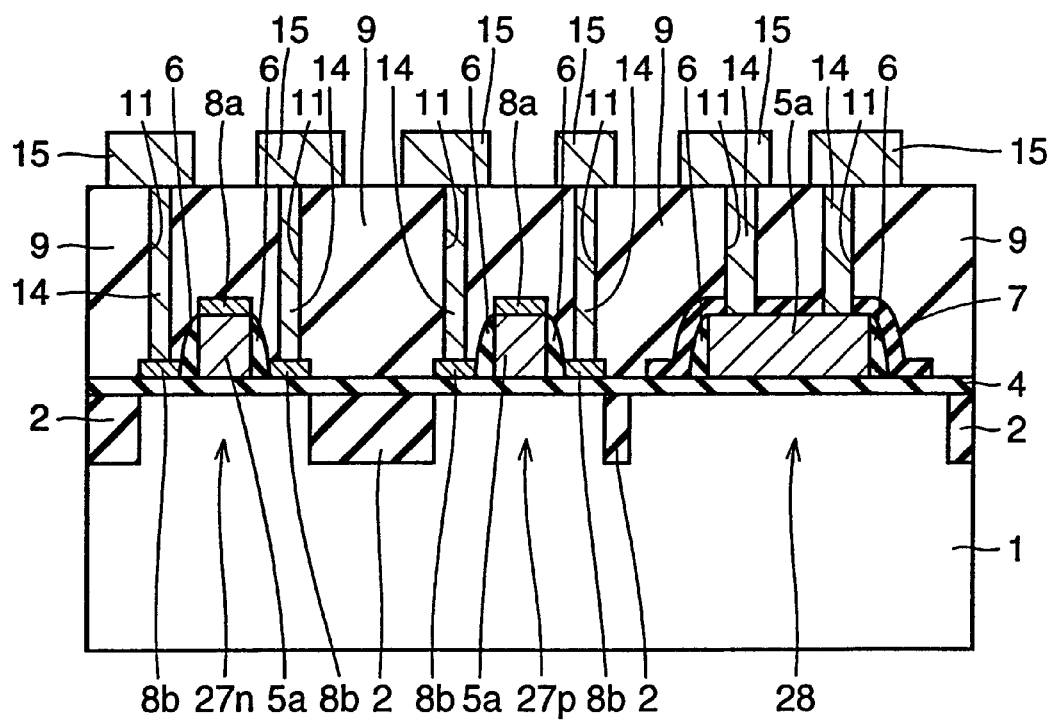
FIG. 22 is a cross section showing a stage in which a metal film filling the contact holes is formed over the interlayer insulating film.

Then, an insulating film 7 for preventing silicide, which is formed of, e.g., an oxide film, is deposited (FIG. 16), and resist 30 covering the region of nMOS of high Vth is arranged (FIG. 17). Then, insulating film 7 is removed from a region other than nMOS of high Vth by etching FIG. 18). Thereafter, a silicide film 8 is deposited on the nMOS and pMOS connected to the high-frequency signal I/O pad, and is patterned to form gate electrodes 8a and source/drain electrodes 8b (FIG. 19). The silicide may be titanium silicide, cobalt silicide or the like. An interlayer insulating film 9 is deposited and flattened (FIG. 20). Then, contact holes 11 extending through interlayer insulating film 9 are formed (FIG. 21), and are filled with a metal film. Further, the metal film is deposited on the interlayer insulating film. The metal film which fills contact holes 11 provides a contact 14 such as a tungsten plug for connection with the lower electrode. The metal film formed on the interlayer insulating film is patterned to form a first-level metal line 15 (FIG. 22).

Thereafter, steps for forming the interlayer insulating film, via holes, second-level metal interconnections and others are performed so that metal interconnections at required number of levels are formed. Finally, a passivation film forming a protection film is formed, and openings of pads are formed, whereby the manufacturing steps are completed.

According to the manufacturing method described above, the silicon MOSFET semiconductor device including, in the protection circuit, the nMOS of high Vth, in which the concentration of p-type impurities in the channel is higher than the concentration of impurities inside the p-well, can be easily and integrally formed on the single substrate. Adjustment of threshold voltage Vth of nMOS transistor 28 can be freely and easily controlled by adjusting the concentration of p-type impurities, which are additionally implanted into the channel region of the nMOS transistor.

Fourth Embodiment

FIGS. 23–31 show a method of manufacturing a silicon MOSFET semiconductor device of a fourth embodiment of the invention. In the silicon MOSFET semiconductor device of the fourth embodiment of the invention, the pMOS transistor of high Vth has such a structure that the concentration of n-type impurities in the channel portion is higher than the concentration of n-type impurities in the n-well. In this embodiment, the high concentration of n-type impurities in the channel of pMOS transistor 28 of high Vth is achieved by additionally implanting n-type ions.

Figure 23:
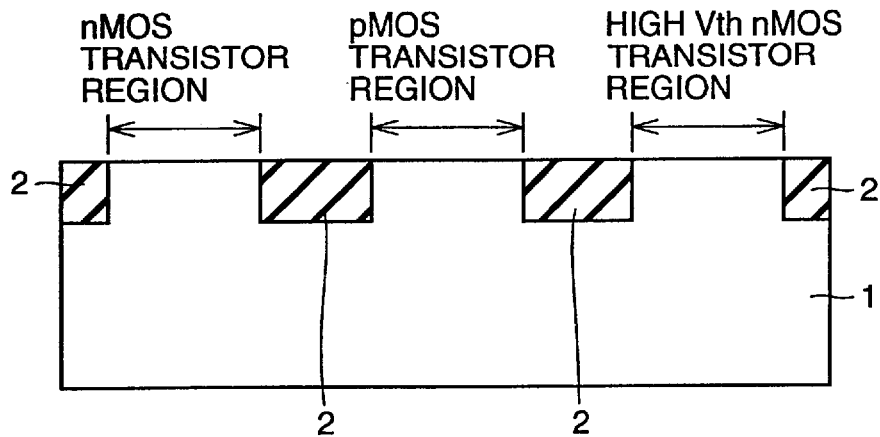
FIG. 23 is a cross section showing a stage for manufacturing a protection circuit portion in a silicon MOSFET semiconductor device of a fourth embodiment of the invention, and particularly a stage in which an isolation film is formed at a silicon substrate.
Figure 24:
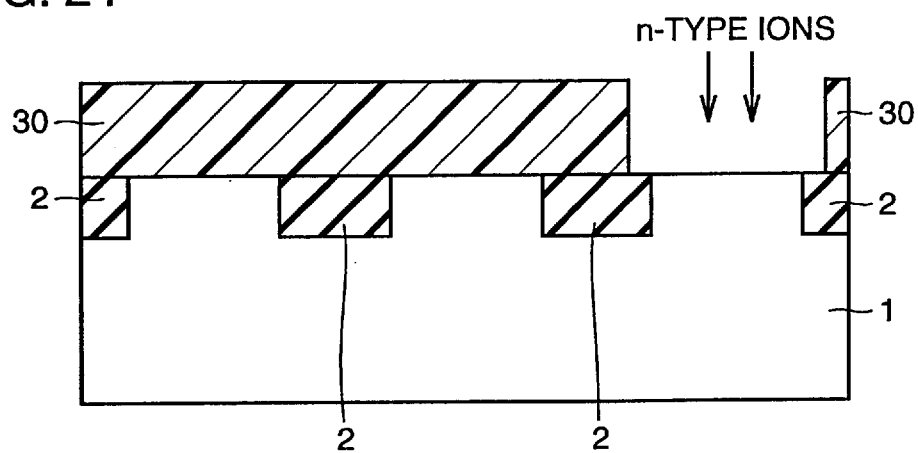
FIG. 24 is a cross section showing a stage in which n-type ions are additionally implanted into a pMOS channel region of a high Vth.

First, isolating oxide films 2 for trench isolation, LOCOS isolation or the like are formed at silicon substrate 1, and then wells are formed (FIG. 23). Using resist 30, n-type ions are then additionally implanted into the channel region (n-well surface side) of the pMOS transistor of high Vth (FIG. 24). By this addition of the n-type ions to the channel region, high threshold voltage Vth can be ensured.

Figure 25:
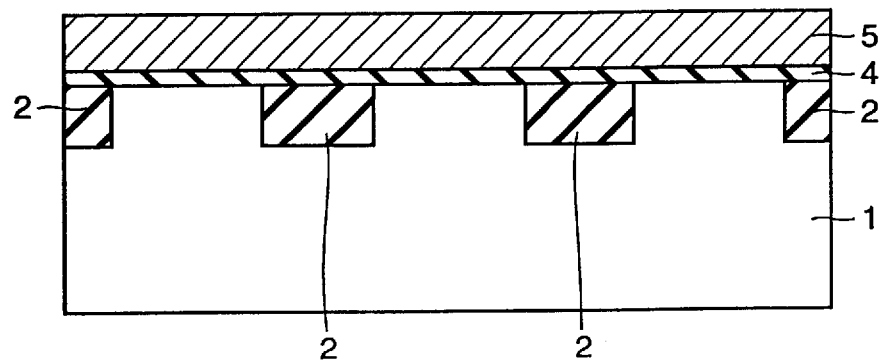
FIG. 25 is a cross section showing a stage in which a gate insulating film and a gate layer are formed.
Figure 26:
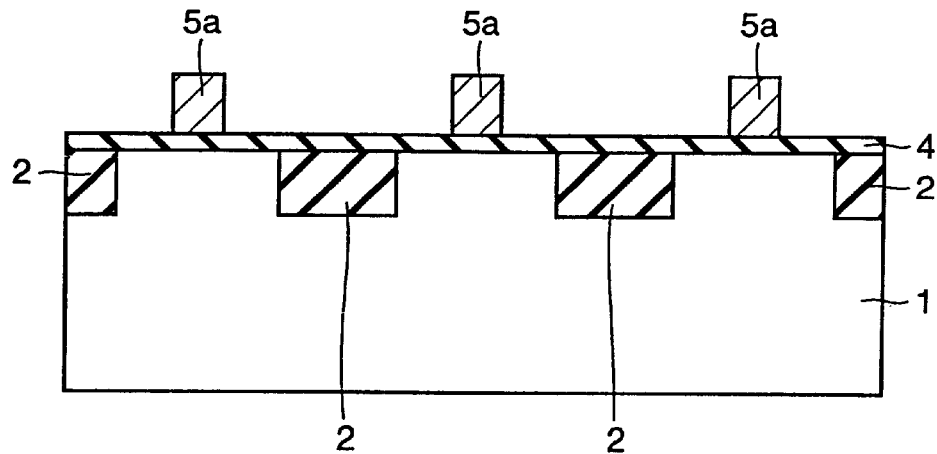
FIG. 26 is a cross section showing a stage in which the gate layer is patterned to form gate electrodes.
Figure 27:
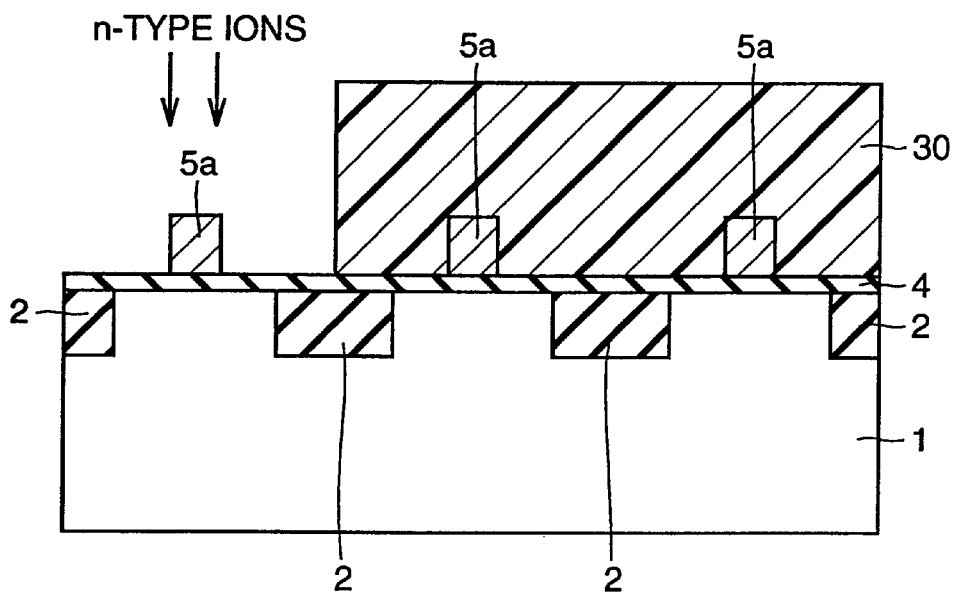
FIG. 27 is a cross section showing a stage in which n-type ions are implanted into the nMOS to form an n⁻-type region of LDD.
Figure 28:
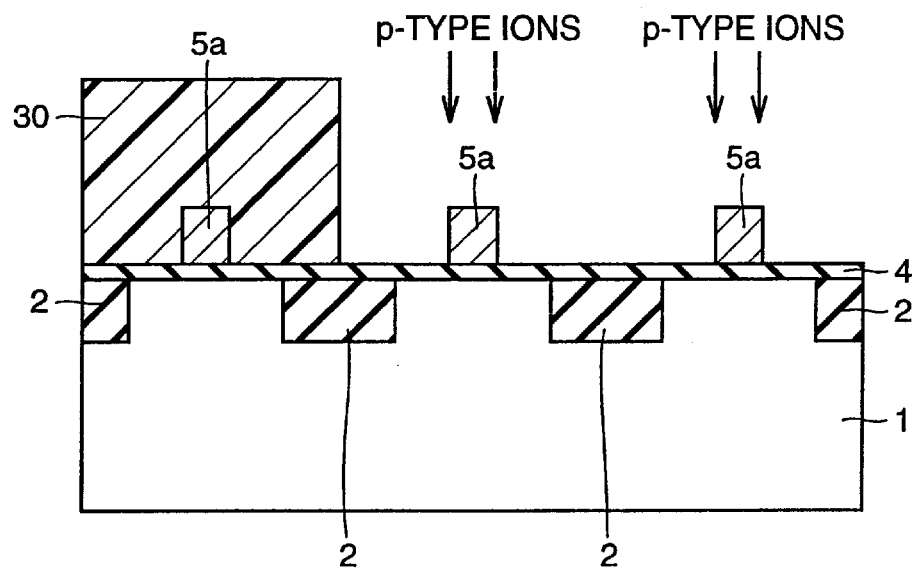
FIG. 28 is a cross section showing a stage in which p-type ions are implanted into the pMOS to form a p⁻-type region of LDD.
Figure 29:
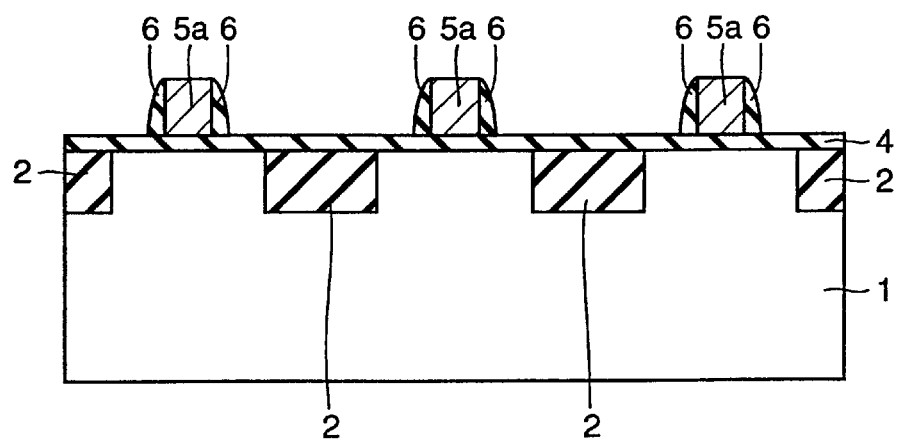
FIG. 29 is a cross section showing a stage in which a sidewall is formed on a side surface of each gate electrode.
Figure 30:
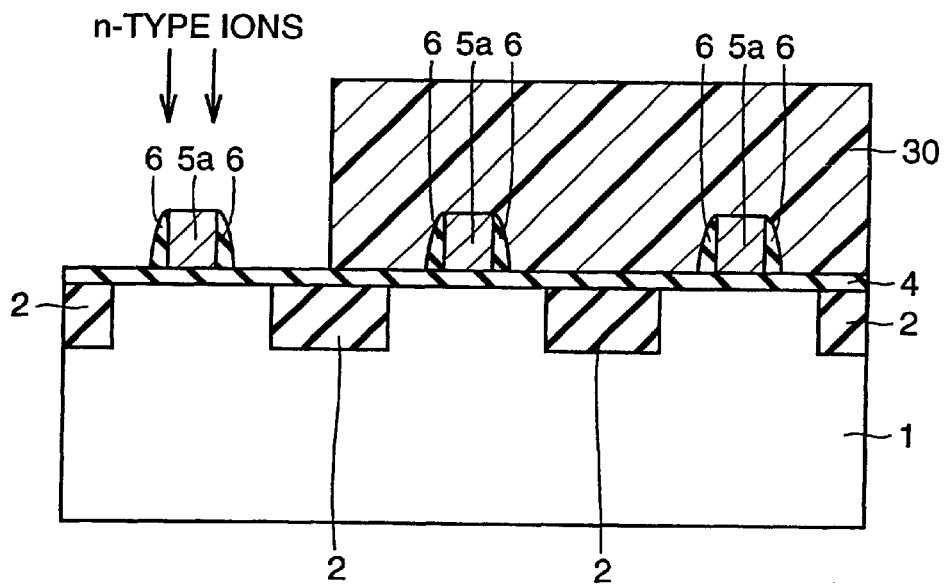
FIG. 30 is a cross section showing a stage in which n-type ions are implanted into a source and a drain of the nMOS.
Figure 31:
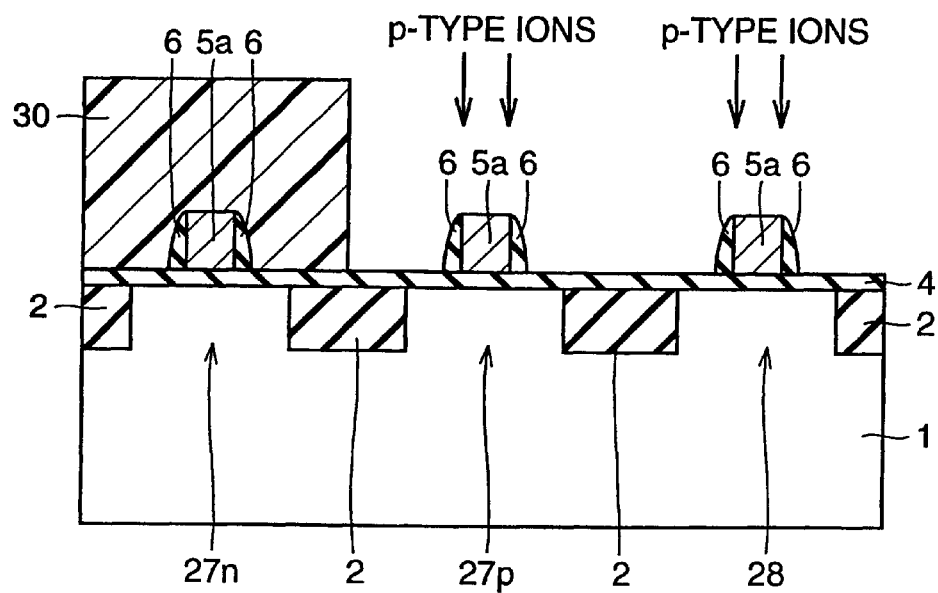
FIG. 31 is a cross section showing a stage in which p-type ions are implanted into a source and a drain of the pMOS.

After this, gate insulating film 4 such as an oxide film or a nitride film is deposited, and polycrystalline silicon film 5, which is not doped with impurities and will form gate electrodes, is formed on gate insulating film 4 (FIG. 25). Then, polycrystalline silicon film 5 is patterned to form gate electrodes 5a (FIG. 26). Thereafter, resist 30 is arranged on a region other than nMOS transistor 27n, and n-type ions are implanted into the source and drain regions of the nMOS so that n$^-$-type regions (not shown) of LDD (Lightly Doped Domain) are formed (FIG. 27). Further, resist 30 is arranged on the region of nMOS transistor 27n, and p-type ions are implanted into pMOS transistor 27p and the source and drain regions of pMOS transistor 28 of high Vth so that p$^-$-type regions (not shown) of LDD are formed (FIG. 28). Then, sidewall 6, which is formed of an oxide film, a nitride film or a combination of them, is formed on each side surface of gate electrode 5a (FIG. 29). After arranging a resist on regions of pMOS transistor 27p and pMOS transistor 28 of high Vth, n-type ions are implanted into the source and drain of nMOS transistor 27n to form n$^+$-type regions (not shown) (FIG. 30). Then, a resist is arranged on a region of nMOS transistor 27n, and p-type ions are implanted into pMOS transistor 27p and the source and drain regions of pMOS transistor 28 of high Vth (FIG. 31).

Thereafter, the same steps as those in the manufacturing method of the third embodiment are performed so that the silicon MOSFET semiconductor device of this embodiment can be produced.

According to the manufacturing method described above, the silicon MOSFET semiconductor device of the embodiment can be easily and integrally formed on the single substrate. Further, the threshold voltage Vth of pMOS transistor 28, which is arranged as the clamp element, can be easily increased. Adjustment of threshold voltage Vth can be freely controlled by adjusting the concentration of p-type impurities, which are additionally implanted into the channel region of the nMOS transistor.

Fifth Embodiment

Figure 32:
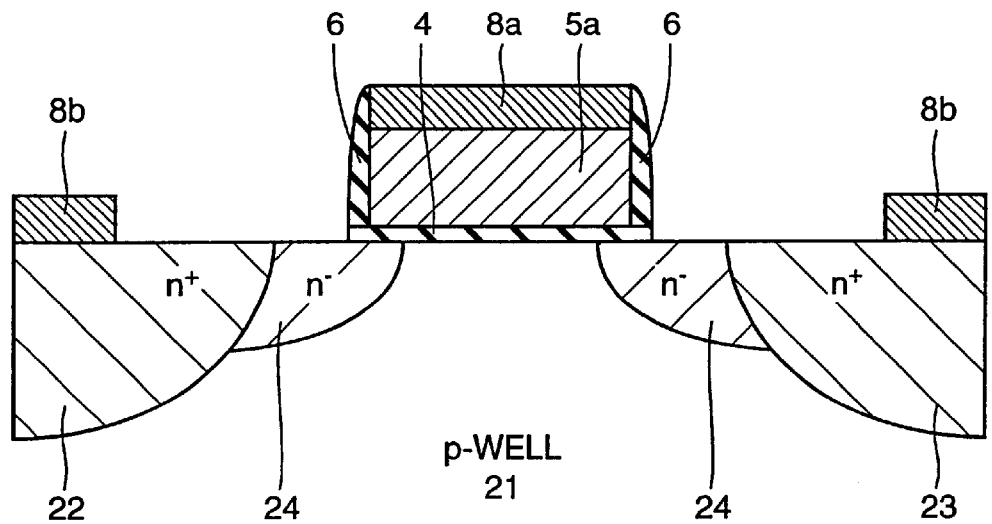
FIG. 32 is a cross section showing a silicon MOSFET semiconductor device of a fifth embodiment of the invention, and particularly a clamp element formed of an nMOS of a high Vth having a gate formed of p-type polycrystalline silicon.

FIG. 32 is a cross section showing an nMOS transistor of high Vth forming the clamp element in a silicon MOSFET semiconductor device of a fifth embodiment of the invention. This embodiment has such a distinctive feature that the gate of nMOS transistor 28 of high Vth is formed of p-type polycrystalline silicon. In ordinary nMOS transistors, the gate is formed of n-type polycrystalline silicon.

In the nMOS transistor of high Vth in this embodiment, a difference in work function is utilized, and high threshold voltage Vth can be achieved by employing the gate made of p-type polycrystalline silicon. Therefore, the clamp element can be formed by arranging the nMOS transistor of high Vth between the Vdd line and the GND line without increasing the number of required masks. As a result, the silicon MOSFET semiconductor device of a high function having high ESD resistance can be produced at a low manufacturing cost.

In an example of manufacturing of the above semiconductor device, p-type ions are implanted with a resist mask offset structure into the gate of nMOS transistor 28 of high Vth in parallel with processing of implanting p-type ions into the source and drain of pMOS transistor 27p.

Figure 33:
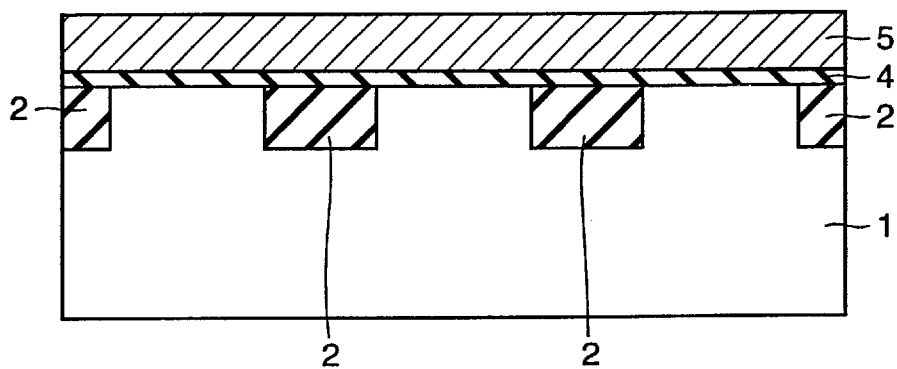
FIG. 33 is a cross section showing a stage in which a gate insulating film and a gate layer are formed during manufacturing of the nMOS in FIG. 32.
Figure 34:
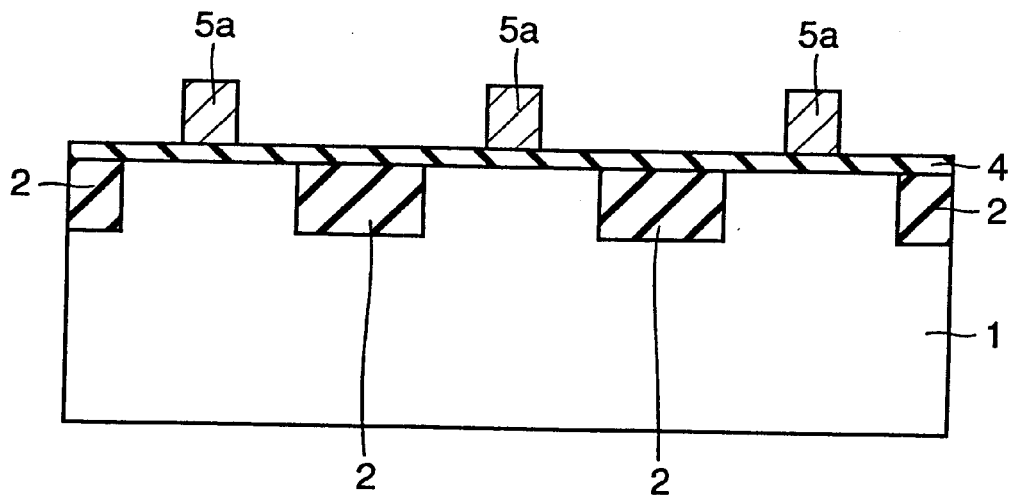
FIG. 34 is a cross section showing a stage in which the gate layer is patterned to form gate electrodes.
Figure 35:
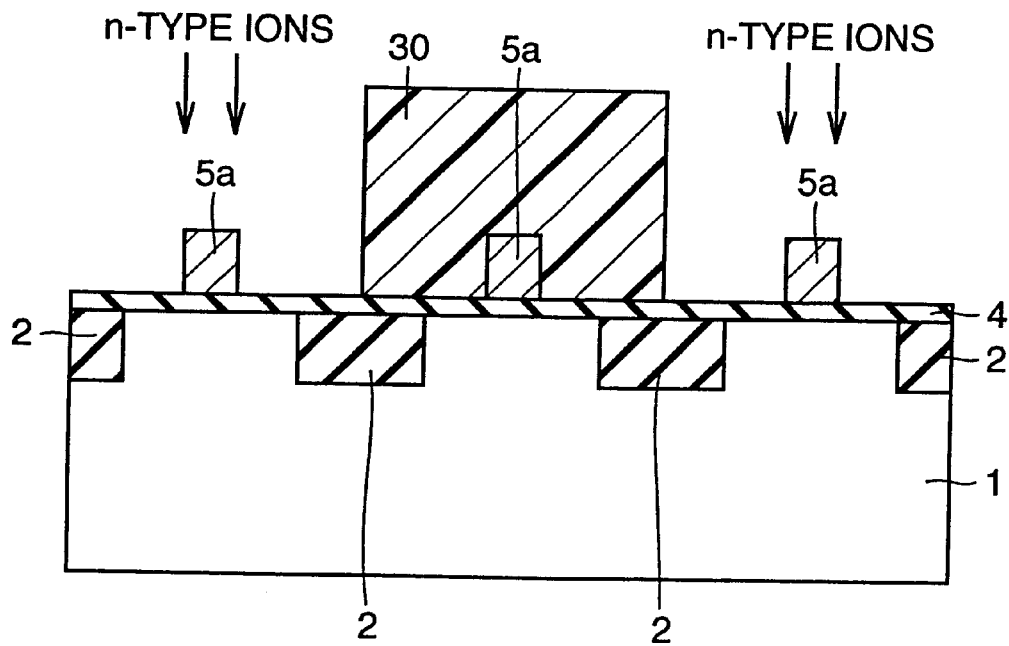
FIG. 35 is a cross section showing a stage in which n-type ions are implanted into the nMOS to form an n⁻-type region of LDD.
Figure 36:
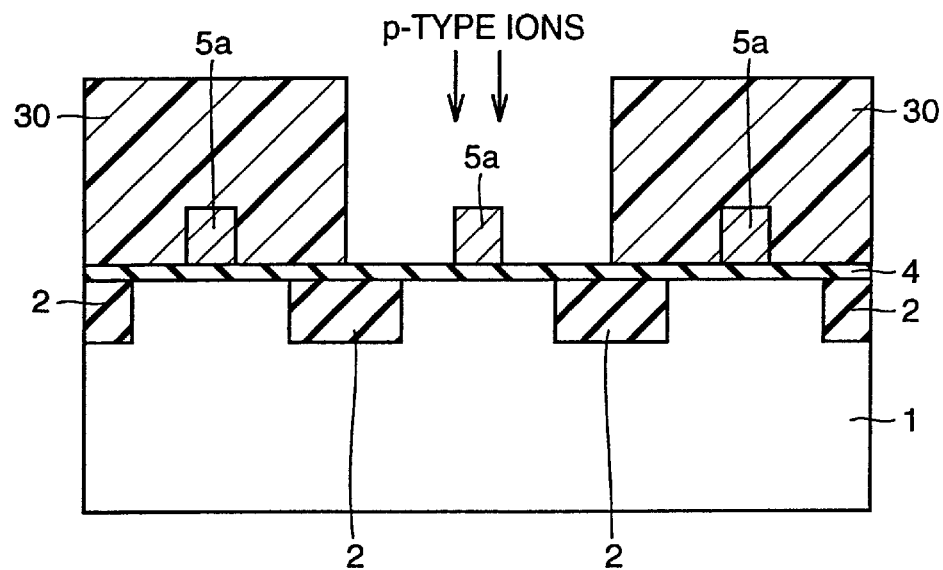
FIG. 36 is a cross section showing a stage in which p-type ions are implanted into the pMOS to form a p⁻-type region of LDD.
Figure 37:
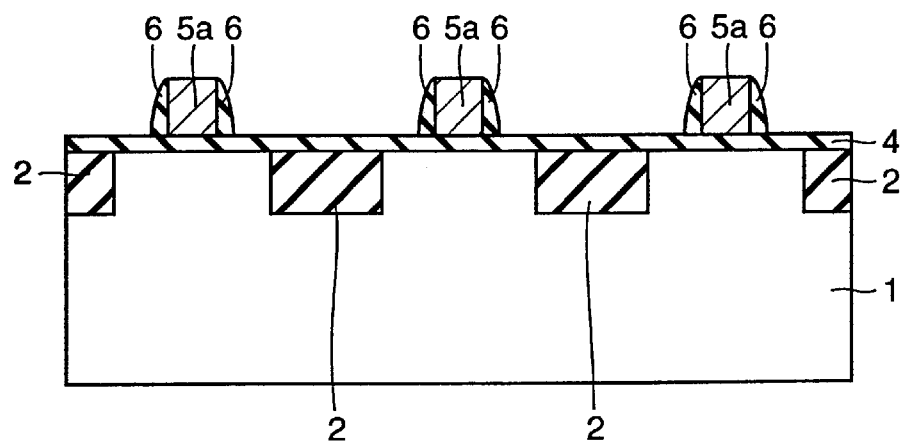
FIG. 37 is a cross section showing a stage in which a sidewall is formed on a side surface of each gate electrode.

First, isolating oxide films 2 for trench isolation, LOCOS isolation or the like are formed at silicon substrate 1, and then wells are formed. Then, gate insulating film 4 such as an oxide film or a nitride film is deposited, and polycrystalline silicon film 5, which is not doped with impurities, is formed on gate insulating film 4 (FIG. 33). Undoped polycrystalline silicon film 5 is patterned to form gate electrodes 5a (FIG. 34). Then, resist 30 is arranged on the pMOS transistor region, and n-type ions are implanted into nMOS transistor 27n and the source and drain regions of nMOS transistor 28 of high Vth so that n⁻-type regions of LDD are formed (FIG. 35). Thereafter, resist 30 is arranged as shown in FIG. 36, and p-type ions are implanted into the source and drain regions of pMOS transistor 27p so that p⁻-type regions of LDD are formed. Then, sidewall 6, which is formed of an oxide film, a nitride film or a combination of them, is formed on each side surface of gate electrode 5a (FIG. 37).

Figure 38:
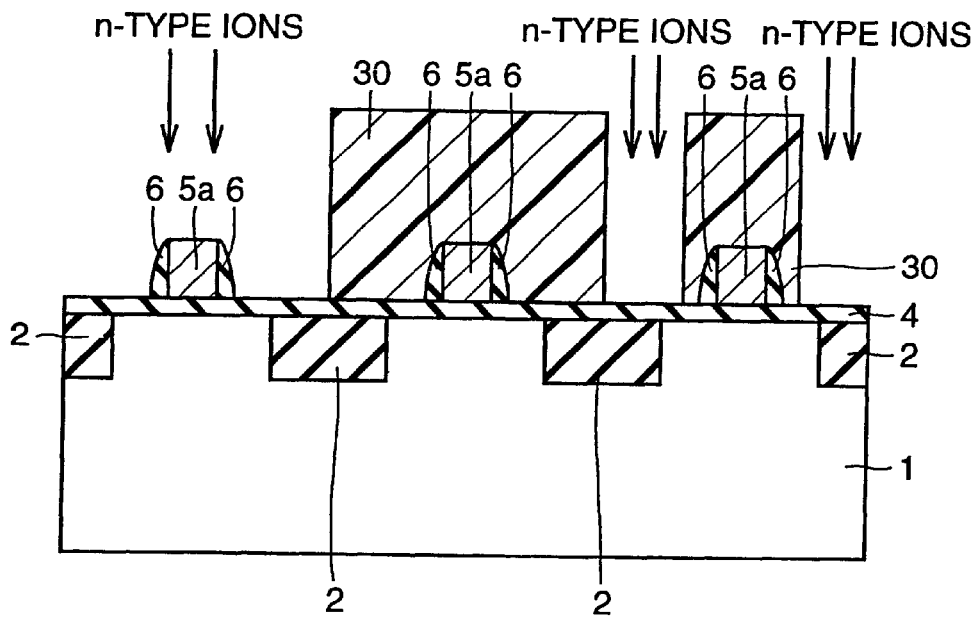
FIG. 38 is a cross section showing a stage in which n-type ions are implanted into a source and a drain of the nMOS.

Then, resist 30 is arranged as shown in FIG. 38, and n-type ions are implanted into the source, drain and gate of nMOS transistor 27n as well as the source and drain of nMOS transistor 28 of high Vth. In this stage, as shown in FIG. 38, n-type ions are not implanted into the gate of nMOS transistor 28 of high Vth. The resist arranged on the region of nMOS transistor 28 of high Vth has a resist mask offset structure for implanting n-type ions not into the gate but into the source and drain. Owing to this structure of the resist, LDD 24 extends outward beyond the side wall, as shown in FIG. 32.

Figure 39:
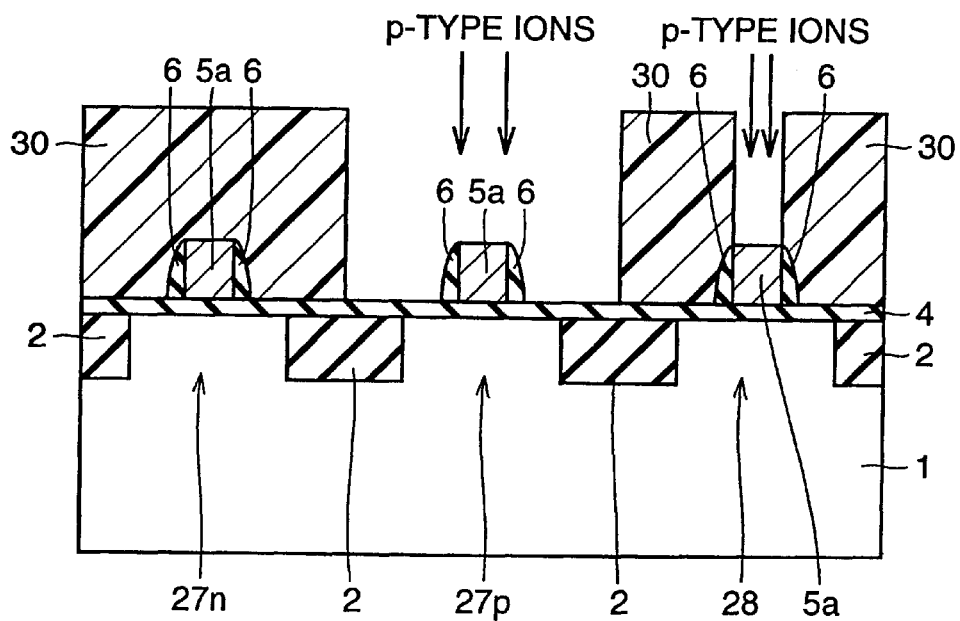
FIG. 39 is a cross section showing a stage in which p-type ions are implanted into a source and a drain of the pMOS and a gate of a high Vth.

Then, resist 30 is arranged as shown in FIG. 39, and p-type ions are implanted into the source, drain and gate of pMOS transistor 27θ as well as the gate of nMOS transistor 28 of high Vth. The resist arranged on the region of nMOS transistor 28 of high Vth is configured to allow implantation of p-type ions into the gate without allowing implantation into the source and drain.

According to the above manufacturing method, threshold voltage Vth of nMOS transistor 28 used in the clamp element can be easily increased.

Sixth Embodiment

Figure 40:
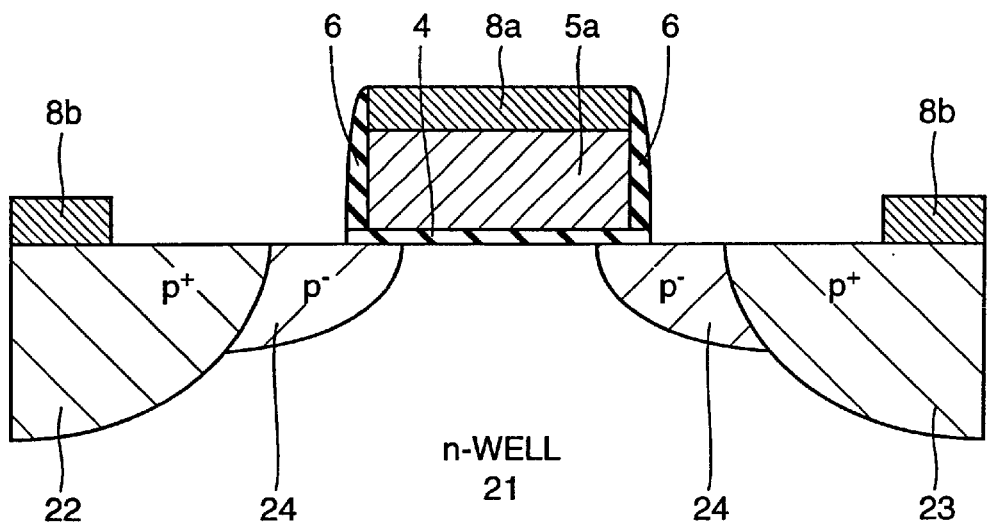
FIG. 40 is a cross section showing a silicon MOSFET semiconductor device of a sixth embodiment of the invention, and particularly a clamp element formed of a pMOS of a high Vth having a gate formed of n-type polycrystalline silicon.
Figure 48:
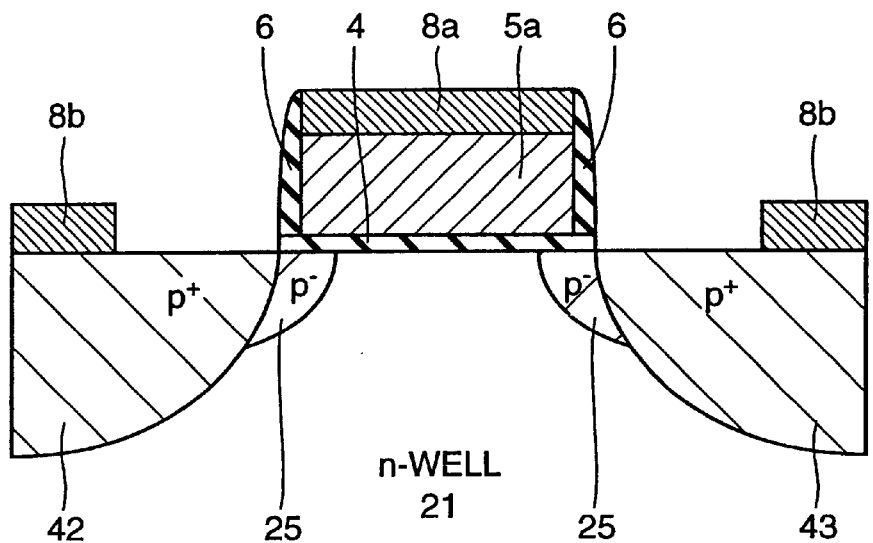
FIG. 48 is a cross section showing the silicon MOSFET semiconductor device of the sixth embodiment of the invention, and particularly a clamp element formed of another pMOS of a high Vth having a gate formed of n-type polycrystalline silicon.

FIGS. 40 and 48 are cross sections of a pMOS transistor of high Vth forming a clamp element of a silicon MOSFET of a sixth embodiment of the invention. This embodiment has such a distinctive feature that the gate of pMOS transistor 28 of high Vth is made of n-type polycrystalline silicon. In ordinary pMOS transistors, the gate is formed of p-type polycrystalline silicon. By employing the gate of pMOS transistor 28 made of n-type polycrystalline silicon, high threshold voltage Vth can be achieved owing to the difference in work function. Therefore, the clamp element having the pMOS transistor of high Vth can be formed at a low manufacturing cost without increasing the number of required masks.

Various kinds of structures and manufacturing methods may be employed for the pMOS transistor of high Vth having the n-type gate region described above. Description will now be given on examples (X), (Y) and (Z) of the structure and manufacturing method of the pMOS transistor of high Vth.

(X): For example, the pMOS transistor of high Vth having the n-type gate region may have a structure shown in FIG. 40. On the opposite sides of the surface portion of n-well 21, there are arranged p⁻-type regions 24 of LDD each extending outward beyond the sidewall, respectively. Source/drain regions 22 and 23 of p⁺-type type are continuous to these wide p⁻-type regions 24. n-type gate region 5a is made of n⁺-type polycrystalline silicon. This pMOS transistor of high Vth is manufactured in the following method.

Figure 41:
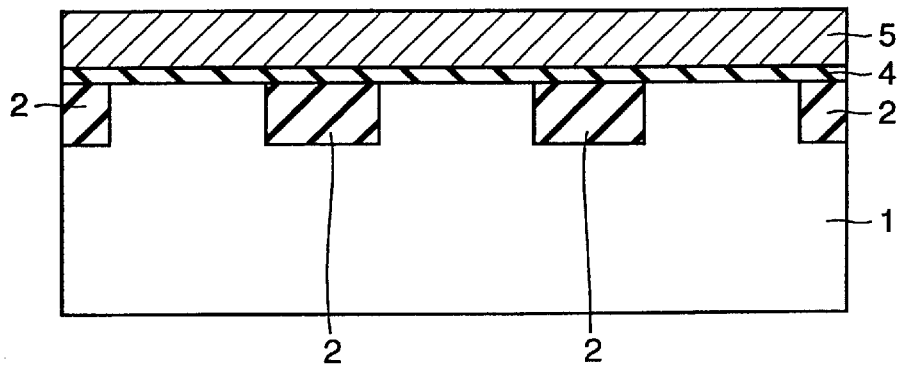
FIG. 41 is a cross section showing a stage in which a gate insulating film and a gate layer are formed during manufacturing of the pMOS in FIG. 40.
Figure 42:
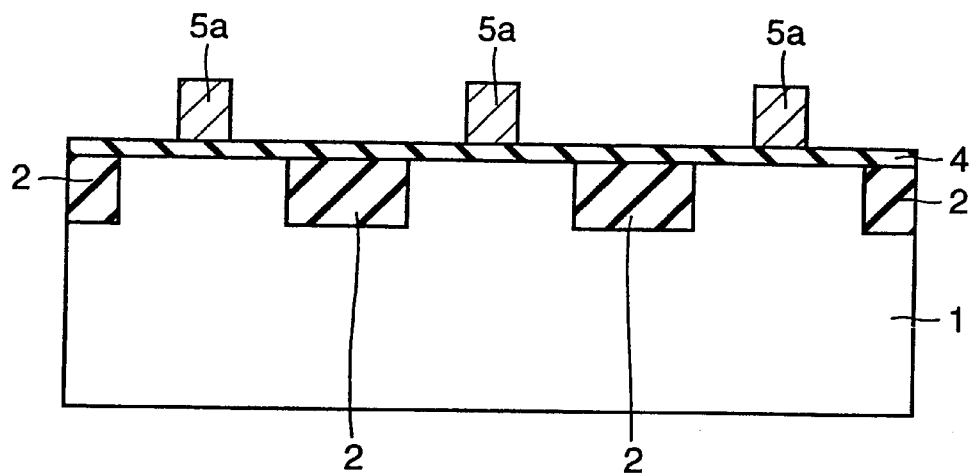
FIG. 42 is a cross section showing a stage in which the gate layer is patterned to form gate electrodes.
Figure 43:
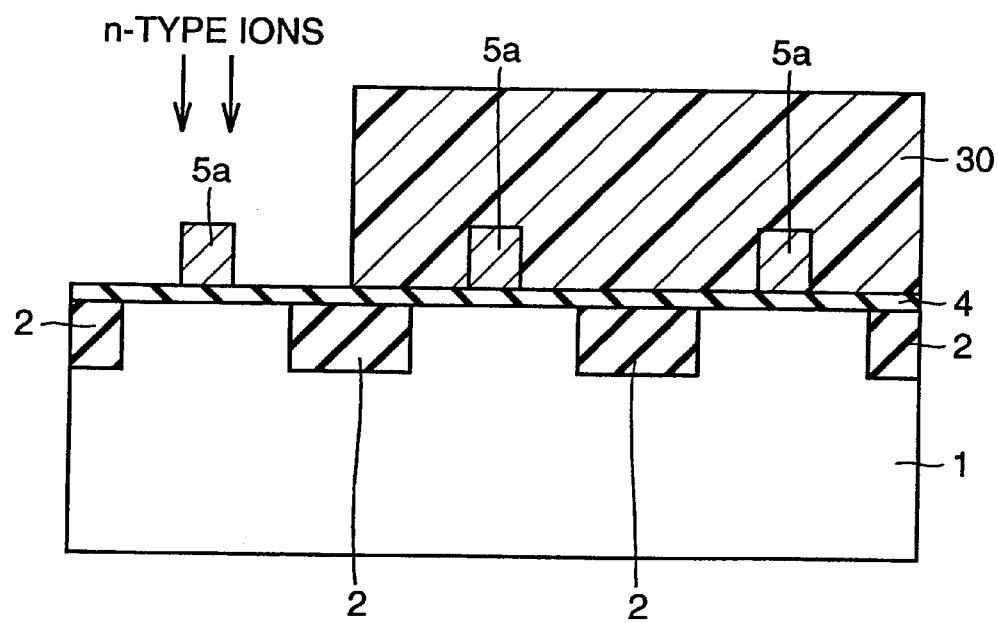
FIG. 43 is a cross section showing a stage in which n-type ions are implanted into the nMOS to form an n⁻-type region of LDD.

First, isolating oxide films for trench isolation, LOCOS isolation or the like are formed at silicon substrate 1, and then wells are formed. Then, gate insulating film 4 such as an oxide film or a nitride film is deposited, and polycrystalline silicon film 5, which is not doped with impurities, is formed on gate insulating film 4 (FIG. 41). Then, polycrystalline silicon film 5 is patterned to form gate electrodes 5a (FIG. 42). Thereafter, resist is arranged as shown in FIG. 43, and n-type ions are implanted into the source and drain regions of nMOS transistor 27n so that n⁻-type regions of LDD are formed.

Figure 44:
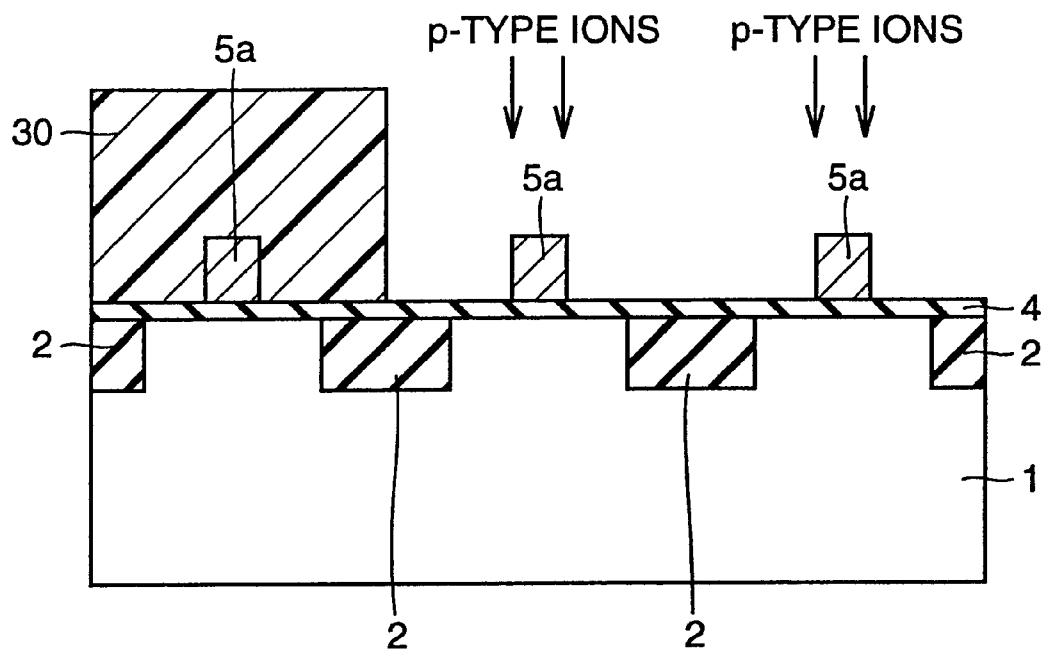
FIG. 44 is a cross section showing a stage in which p-type ions are implanted into the pMOS to form a p⁻-type region of LDD.
Figure 45:
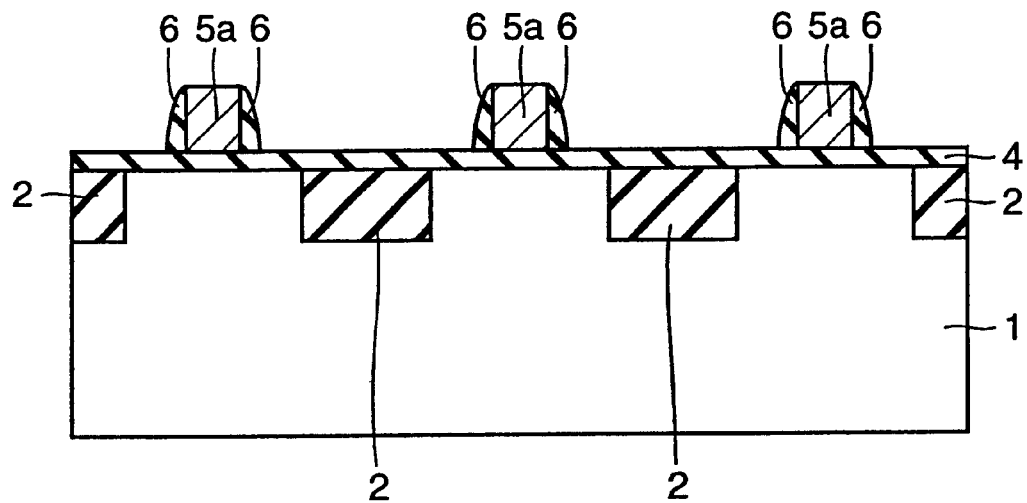
FIG. 45 is a cross section showing a stage in which a sidewall is formed on a side surface of each gate electrode.

Further, resist is arranged as shown in FIG. 44, and p-type ions are implanted into pMOS transistor 27p and the source and drain regions of pMOS transistor 28 of high Vth so that p⁻-type regions of LDD are formed. Then, the sidewall, which is formed of an oxide film, a nitride film or a combination of them, is formed on each side surface of the gate electrode (FIG. 45).

Figure 46:
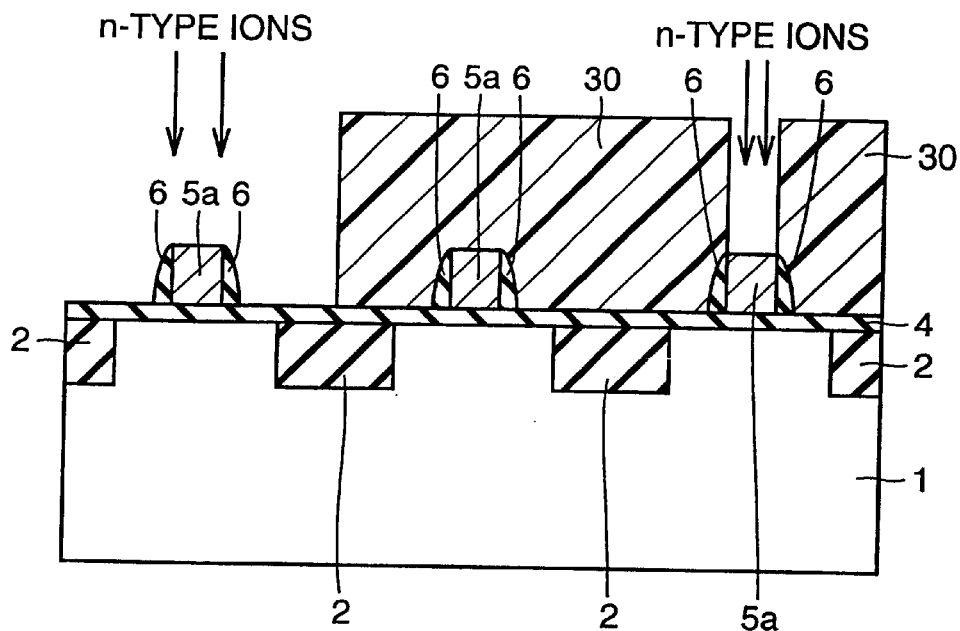
FIG. 46 is a cross section showing a stage in which n-type ions are implanted into a source, a drain and a gate of the nMOS and a gate of the pMOS of high Vth.
Figure 47:
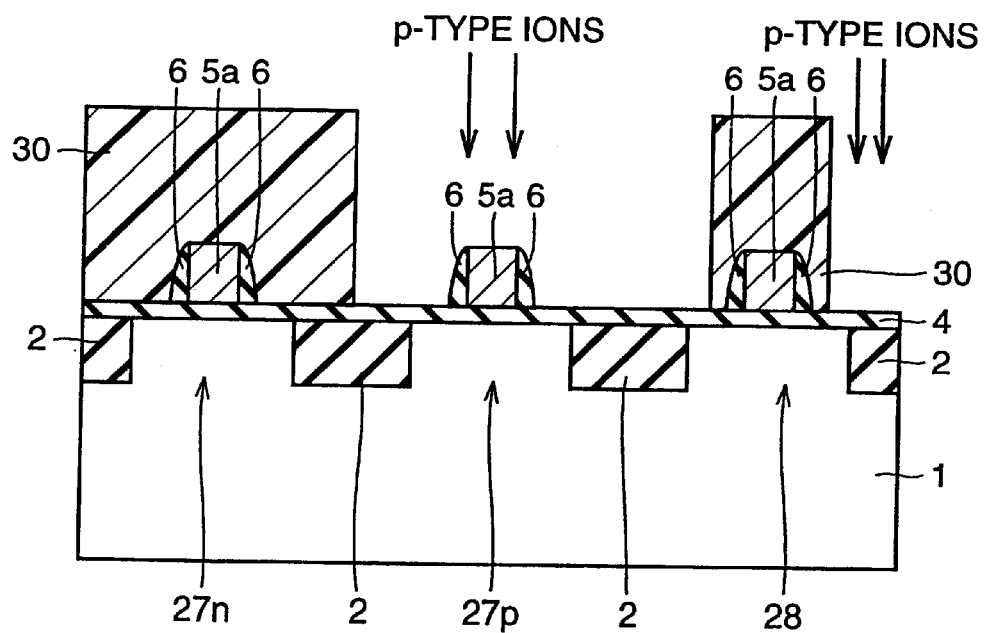
FIG. 47 is a cross section showing a stage in which p-type ions are implanted into a source, a drain and a gate of the pMOS and a source and a drain of the pMOS of high Vth.

After arranging a resist as shown in FIG. 46, n-type ions are implanted into the source and drain of nMOS transistor 27n as well as the gate of pMOS transistor 28 of high Vth. The resist on pMOS transistor 28 of high Vth is arranged such that the n-type ions may be implanted into the gate, but may not be implanted into the source and drain thereof. Thereafter, p-type ions are implanted into pMOS transistor 27p and the source and drain of pMOS transistor 28 of high Vth (FIG. 47). In this step of implanting the p-type ions, the ion implantation is performed using the resist, which covers each side wall of pMOS transistor 28 of high Vth, as a mask. Therefore, LDD 24 has a form extending outward beyond side wall 6, as shown in FIG. 40.

Subsequent manufacturing steps are similar to those in other embodiments.

Through the above steps, the gate of n-conductive type can be easily formed in pMOS transistor 28 of high Vth, and thereby high threshold voltage Vth can be easily obtained.

(Y): As another example, the pMOS transistor of high Vth having the n-type gate region may have a structure shown in FIG. 48. On the opposite sides of the surface portion of n-well 21, there are arranged p⁻-type regions 25 of LDD not extending outward beyond sidewall 6, respectively. Source and drain regions 42 and 43 of p⁺-type type are continuous to these wide p⁻-type regions 25. n-type gate region 5a is made of n⁺-type polycrystalline silicon. This pMOS transistor of high Vth is manufactured in the following method.

Figure 49:
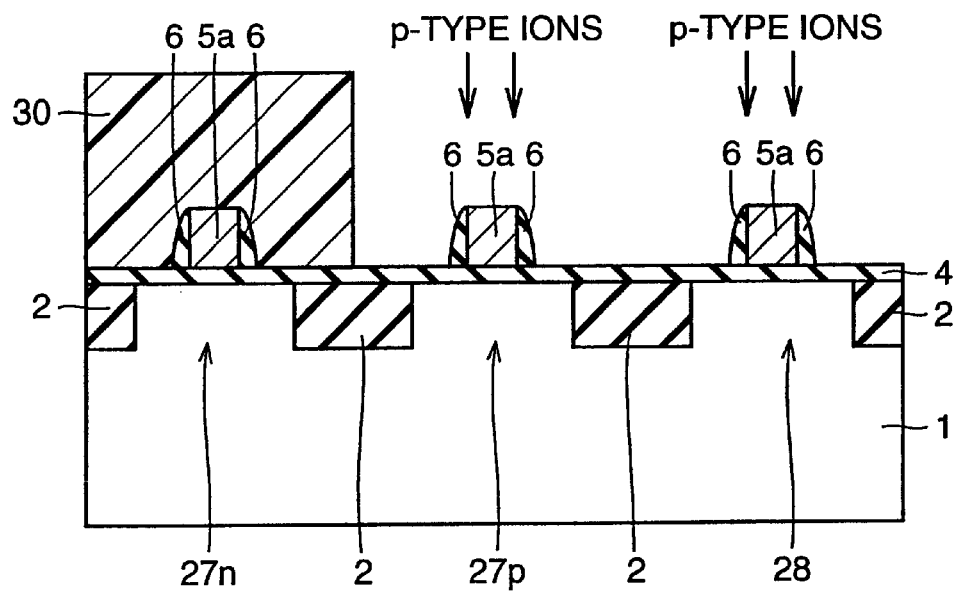
FIG. 49 is a cross section showing a stage in which p-type ions are implanted into a source, a drain and a gate of the pMOS and a source, a drain and a gate of the pMOS of high Vth at a dose smaller than that of implantation of n-type ions into the nMOS.

The manufacturing method of (Y) includes the step of arranging the resist, which is shown in FIG. 46 and is employed in the foregoing case (X), and implanting n-type ions into the source and drain of nMOS transistor 27n and the gate of pMOS transistor 28 of high Vth. This step and the steps preceding this are the same as those in the case (X). In the preceding step, n-type ions are implanted into the gate of pMOS transistor 28 of high Vth. Then, the resist is arranged only on the region of nMOS transistor 27n as shown in FIG. 49, and p-type ions are implanted. In this step, the p-type ions are implanted at a doze smaller than that of n-type ions implanted in the preceding step. Therefore, the gate of pMOS transistor 28 of high Vth still keeps the n-conductivity. In the process of implanting p-type ions into the source and drain of pMOS transistor 28 of high Vth shown in FIG. 49, each side wall functions as a mask so that the LDD do not extend outward beyond the sidewall.

As a result, the pMOS transistor of high Vth having the gate of n-type polycrystalline silicon can be easily manufactured while simplifying the arrangement of resists and reducing the manufacturing cost.

(Z) In this case, the pMOS transistor of high Vth having the n-type gate region has the same structure as that shown in FIG. 40. On the opposite sides of the surface portion of n-well 21, there are arranged p⁻-type regions 24 of LDD not extending outward beyond the sidewalls, respectively. Source/drain regions 22 and 23 of p⁺-type type are continuous to these wide p⁻-type regions 24. n-type gate region 5a is made of n⁺-type polycrystalline silicon. This pMOS transistor of high Vth is manufactured in the following method.

First, an interlayer insulating film is formed on silicon substrate 1, and the wells are formed. Thereafter, gate insulating film 4 is formed, and undoped polycrystalline silicon film 5 is deposited on gate insulating film 4. These steps are similar to those in the case (X) shown in FIG. 41 and others.

Figure 50:
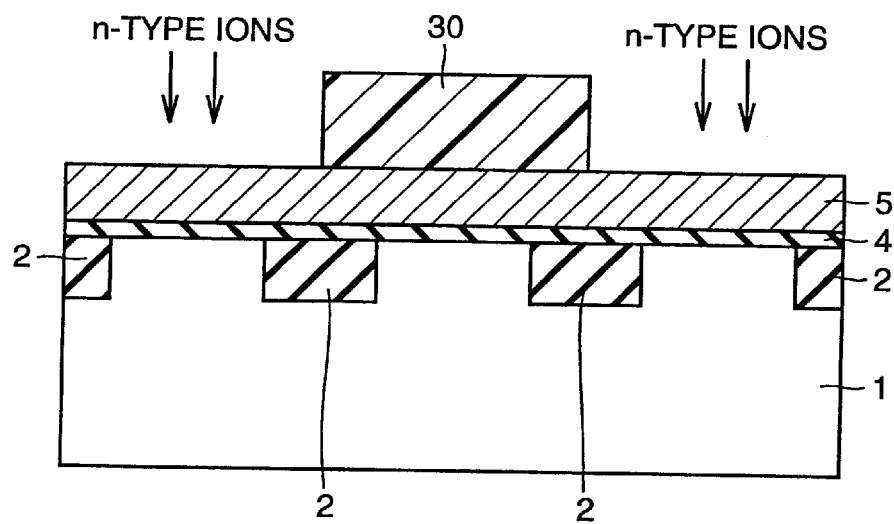
FIG. 50 is a cross section showing the silicon MOSFET semiconductor device of the sixth embodiment of the invention, and particularly a stage in which a resist is arranged on a gate layer when producing a clamp element formed of further another pMOS of a high Vth having a gate formed of n-type polycrystalline silicon.
Figure 51:
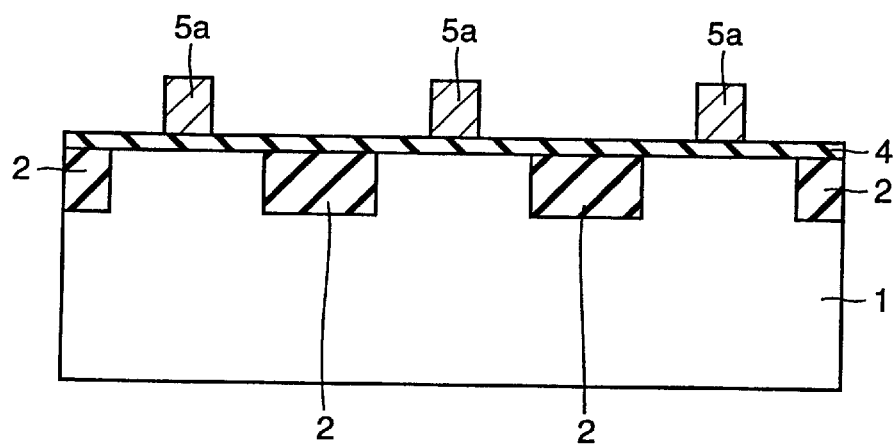
FIG. 51 is a cross section showing a stage in which the gate layer is patterned to form gate electrodes.
Figure 52:
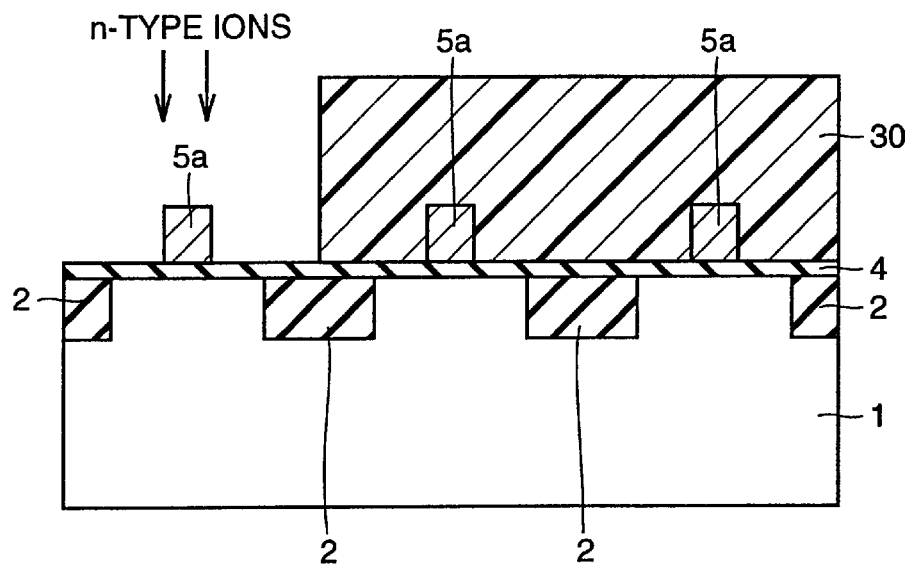
FIG. 52 is a cross section showing a stage in which n-type ions are implanted into the nMOS to form an n⁻-type region of LDD.

The resist is arranged as shown in FIG. 50, and n-type ions are implanted for forming the gates of nMOS transistor 27n and nMOS transistor 28 of high Vth. Thereafter, polycrystalline silicon film 5 is patterned to form gate electrode 5a (FIG. 51). Then, the resist is arranged as shown in FIG. 52, and n-type ions are implanted into the source and drain of nMOS transistor 27n so that the n⁻-type region of LDD is formed.

Figure 53:
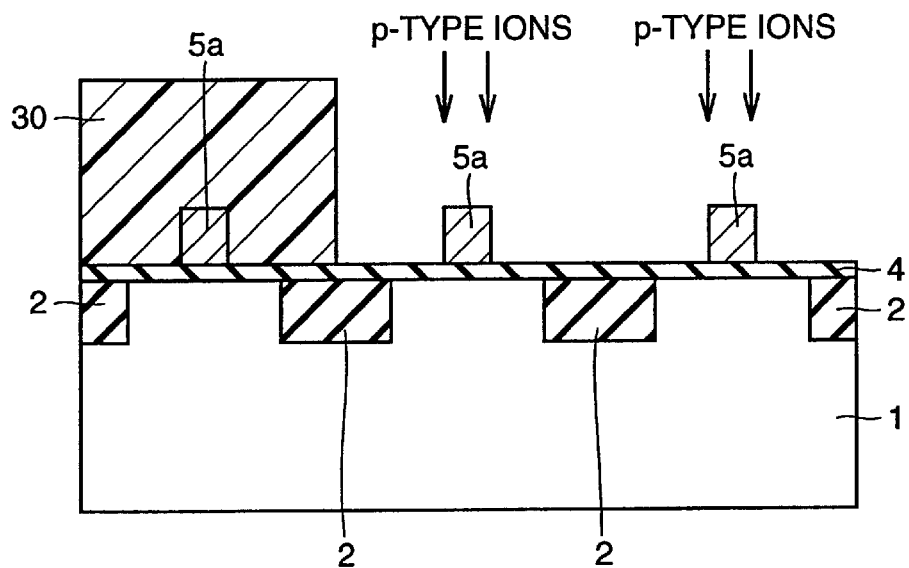
FIG. 53 is a cross section showing a stage in which p-type ions are implanted into the pMOS to form a p⁻-type region of LDD.
Figure 54:
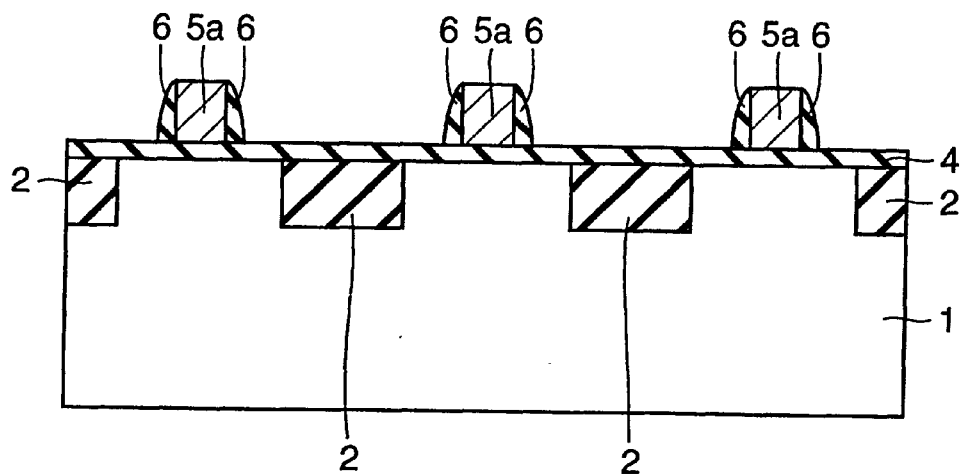
FIG. 54 is a cross section showing a stage in which a sidewall is formed on a side surface of each gate electrode.

Then, the resist is arranged as shown in FIG. 53, and p-type ions are implanted into the sources and drains of pMOS transistor 27p and pMOS transistor 28 of high Vth to form the p⁻-type regions of LDD. Then, the sidewall, which is formed of an oxide film, a nitride film or a combination of them, is formed on each side surface of the gate electrode (FIG. 54).

Figure 55:
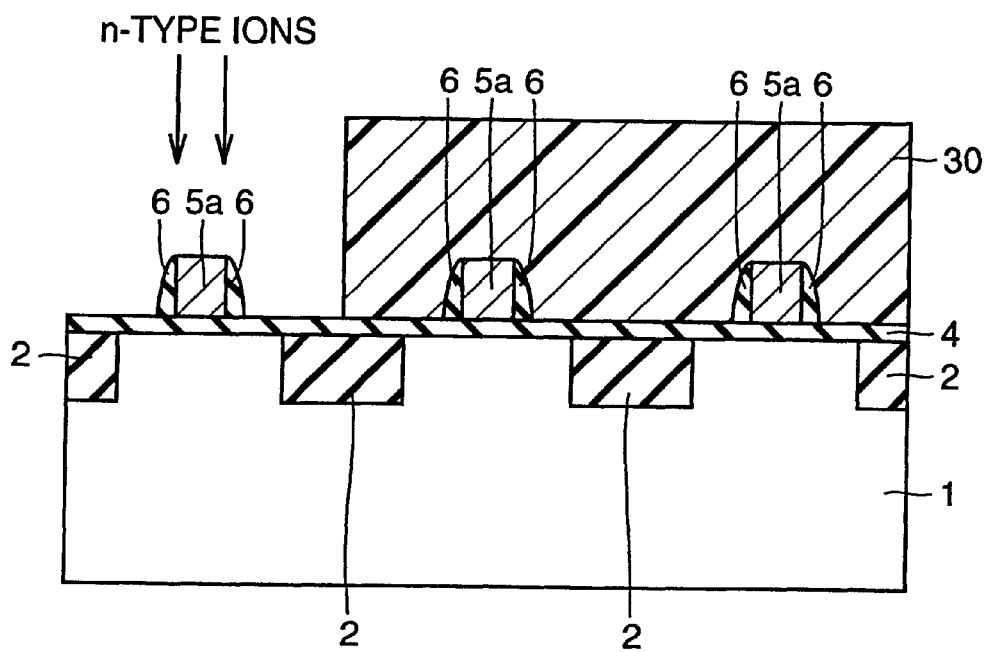
FIG. 55 is a cross section showing a stage in which n-type ions are implanted into a source, a drain and a gate of the nMOS.
Figure 56:
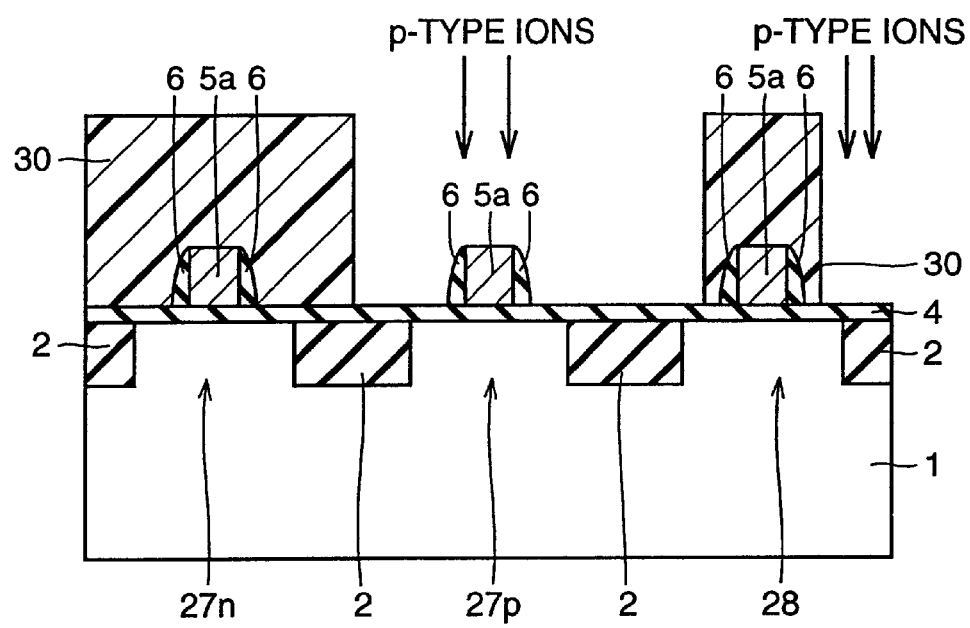
FIG. 56 is a cross section showing a stage in which p-type ions are implanted into a source, a drain and a gate of the pMOS and a source and a drain of the pMOS of high Vth.

After arranging the resist as shown in FIG. 55, n-type ions are implanted into the source and drain of nMOS transistor 27n. Thereafter, the resist shown in FIG. 56 is arranged, and p-type ions are implanted into pMOS transistor 27p and the source and drain of pMOS transistor 28 of high Vth. In the step of implanting the p-type ions, resist 30 is arranged to cover each sidewall of pMOS transistor 28 of high Vth, and is used as a mask for implanting p-type ions. Therefore, the region of LDD extends outward beyond the side wall, and the pMOS transistor of high Vth, which has an enlarged LDD as shown in FIG. 40, can be obtained.

The manufacturing steps after the above are the same as those in the other embodiments.

Through the above steps, the gate of n-conductive type can be easily formed in pMOS transistor 28 of high Vth, and high threshold voltage Vth can be obtained.

In the method of manufacturing the foregoing clamp element 28, the gate insulating film may be increased by an appropriate manner for increasing the threshold voltage Vth, as already described.

Seventh Embodiment

Figure 57:
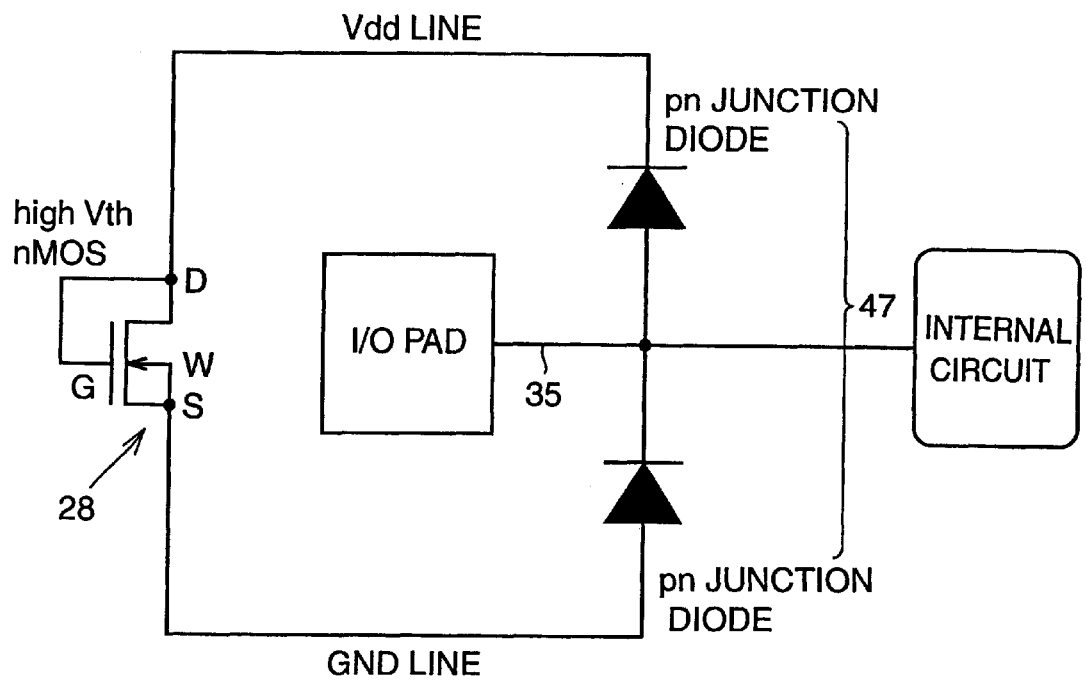
FIG. 57 is a circuit diagram showing a division circuit formed of pn junction diodes and a clamp element formed of a pMOS of a high Vth in a silicon MOSFET semiconductor device of a seventh embodiment of the invention.

In FIG. 57, a diode-type division circuit 47 using a pn junction diode is arranged in the high-frequency signal I/O pad, and nMOS transistor 28 of high Vth for the clamp element is arranged between the Vdd line and the GND line. The pn junction diode has a junction area of, e.g., $10 \mu m^2$–10 $mm^2$. Usually, the pn junction diode connected to the Vdd lines is an element passing the positive voltage, and the pn junction diode connected to the GND line is an element passing the negative voltage. nMOS transistor 28 of high Vth has a gate width, e.g., of 100 $\mu m$–10 mm.

Diode-type division circuit 47 is functionally the same as the division circuit provided with the pMOS and nMOS in the off state. Therefore, it can clamp the voltages on the Vdd and GND lines at desired low voltages when the ESD surge is applied. Further, the reverse breakdown of diode does not occur, and the ESD protection operation can be performed in all the cases. Thereby, high ESD resistance can be achieved without causing a malfunction, and the silicon MOSFET semiconductor device having good high-frequency characteristics can be obtained.

Eighth Embodiment

Figure 58:
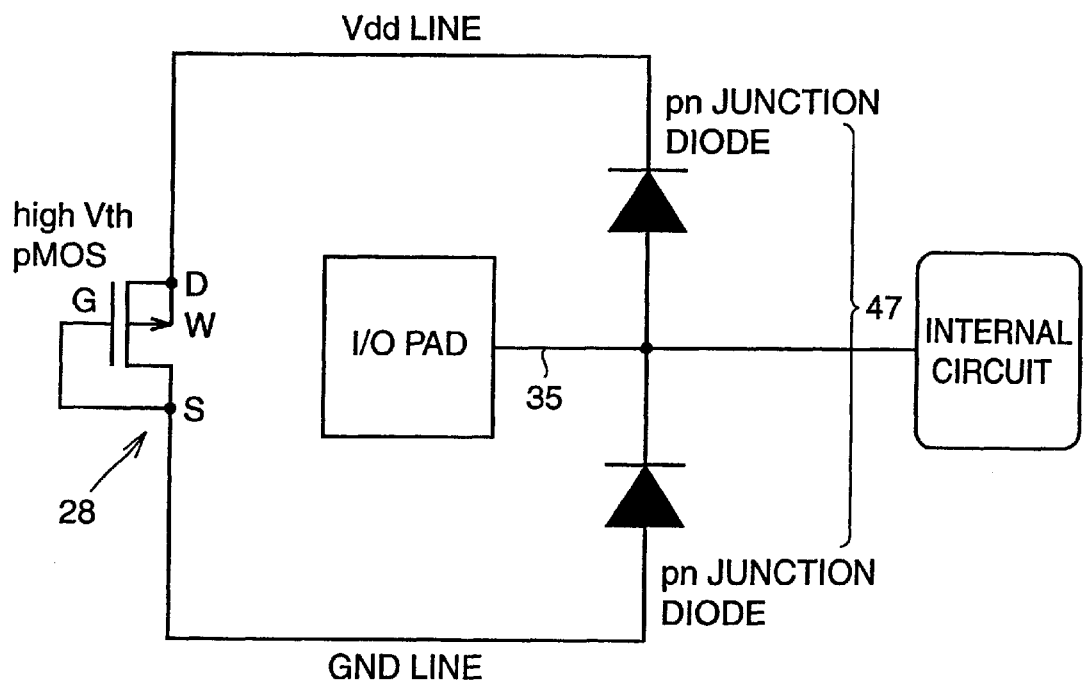
FIG. 58 is a circuit diagram showing a division circuit formed of pn junction diodes and a clamp element formed of a pMOS of a high Vth in a silicon MOSFET semiconductor device of an eighth embodiment of the invention.
Figure 59:
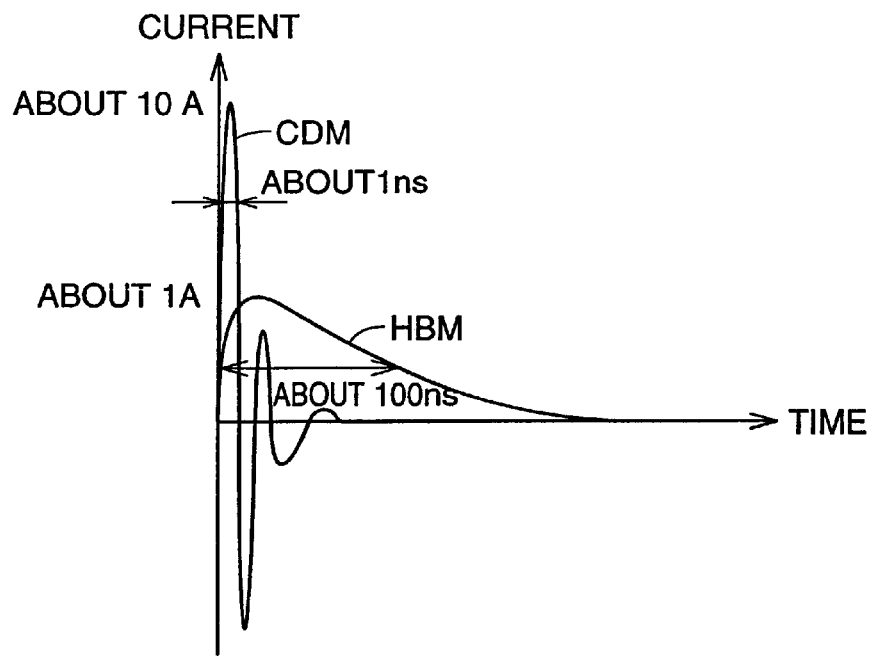
FIG. 59 shows an example of a current waveform of ESD.
Figure 60:
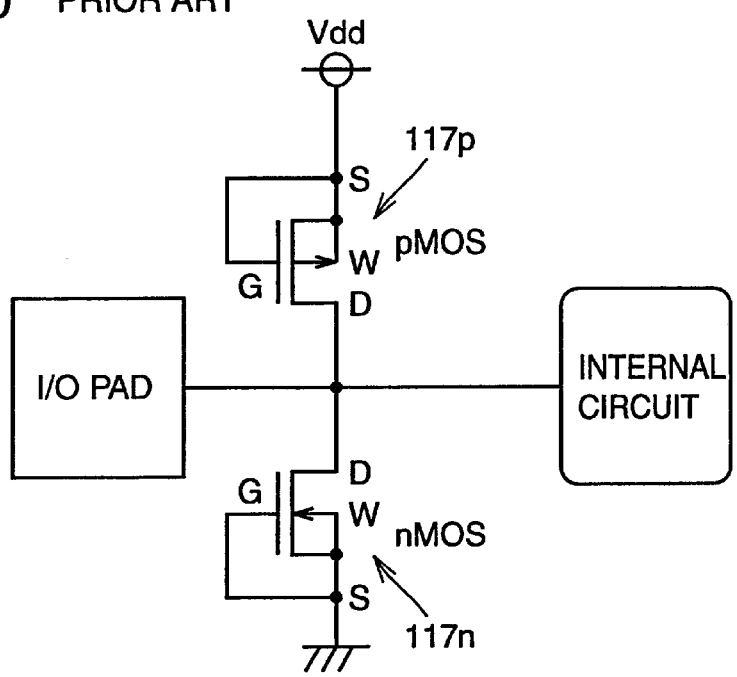
FIG. 60 is a circuit diagram of an ESD protection circuit using MOS transistors in the off state.
Figure 61:
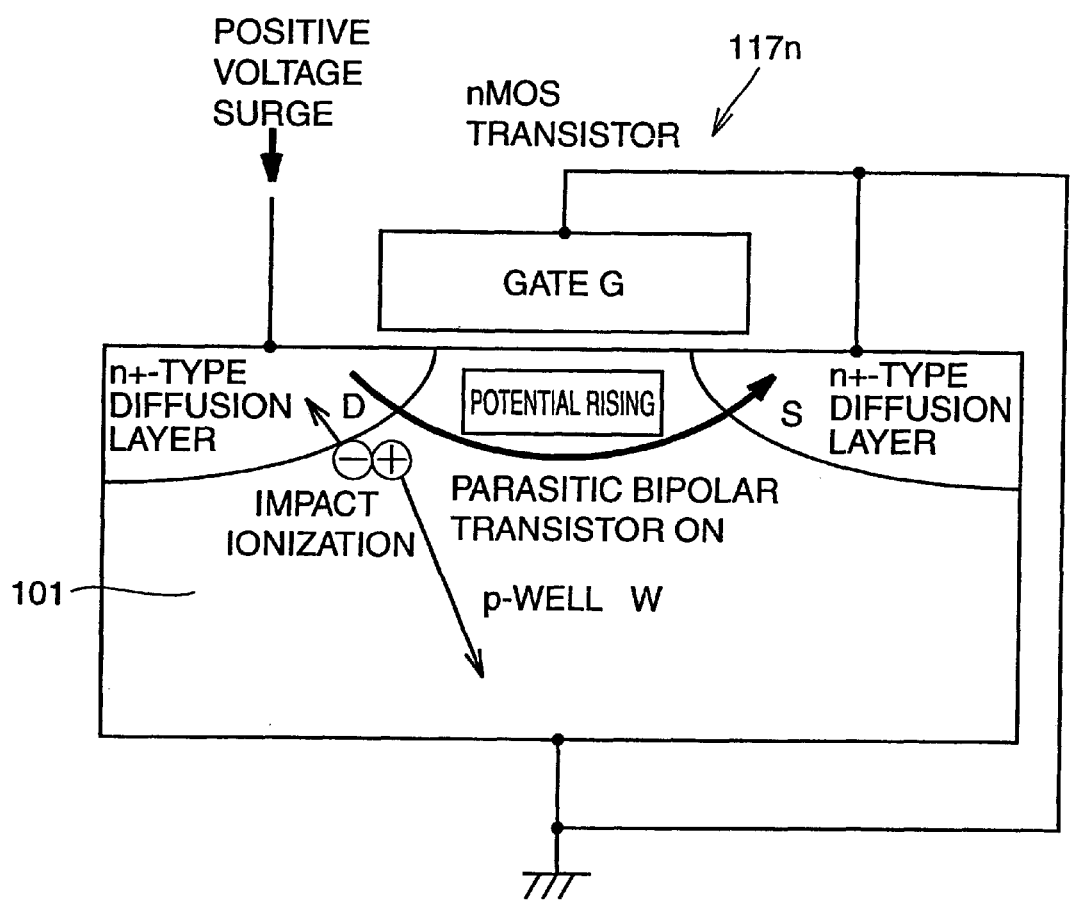
FIG. 61 shows a parasitic bipolar operation performed in the ESD protection circuit using the MOS transistors in the off state when ESD occurs.
Figure 62:
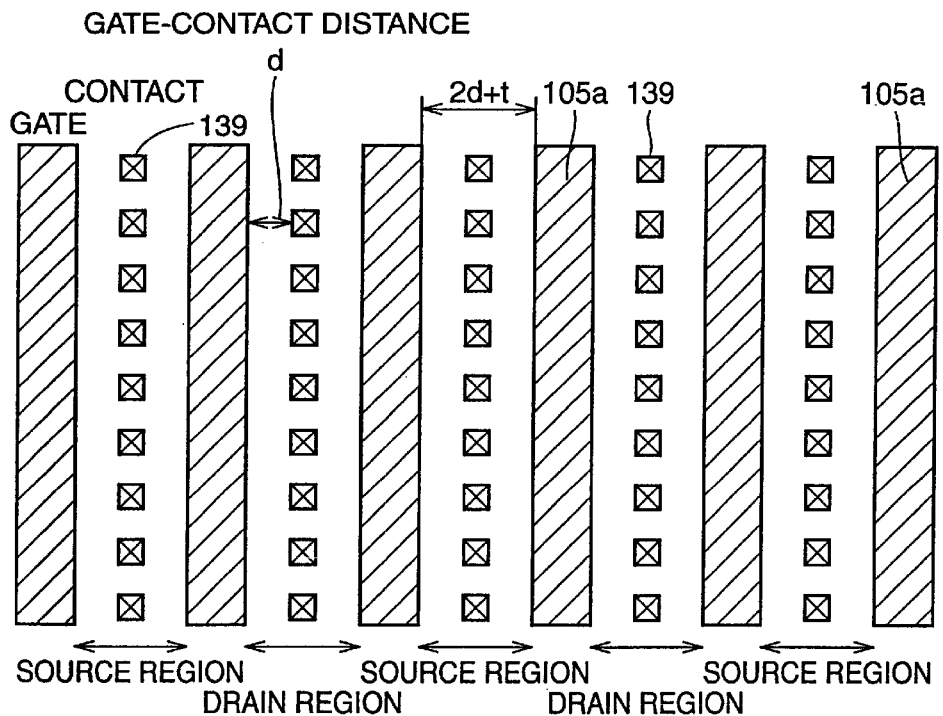
FIG. 62 is a plan showing arrangement of gates and source/drain contacts of MOS transistors in the ESD protection circuit shown in FIG. 60.
Figure 63:
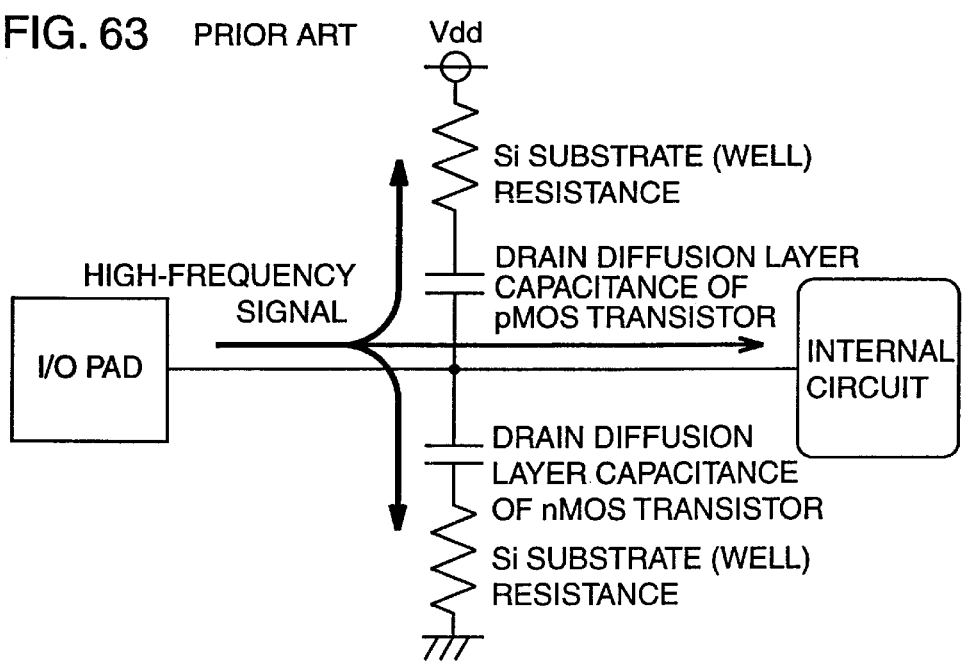
FIG. 63 is a schematic equivalent circuit diagram showing the ESD protection circuit in FIG. 60 and a flow of a high-frequency signal to a silicon substrate.
Figure 64:
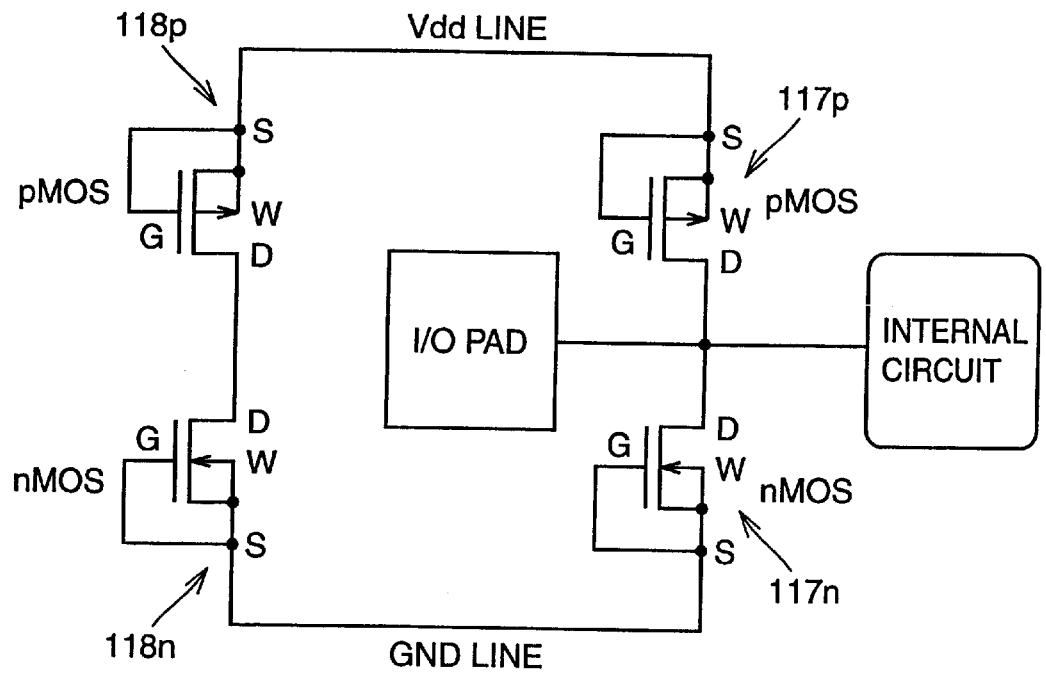
FIG. 64 shows an example of a structure of a conventional ESD protection circuit.
Figure 65:
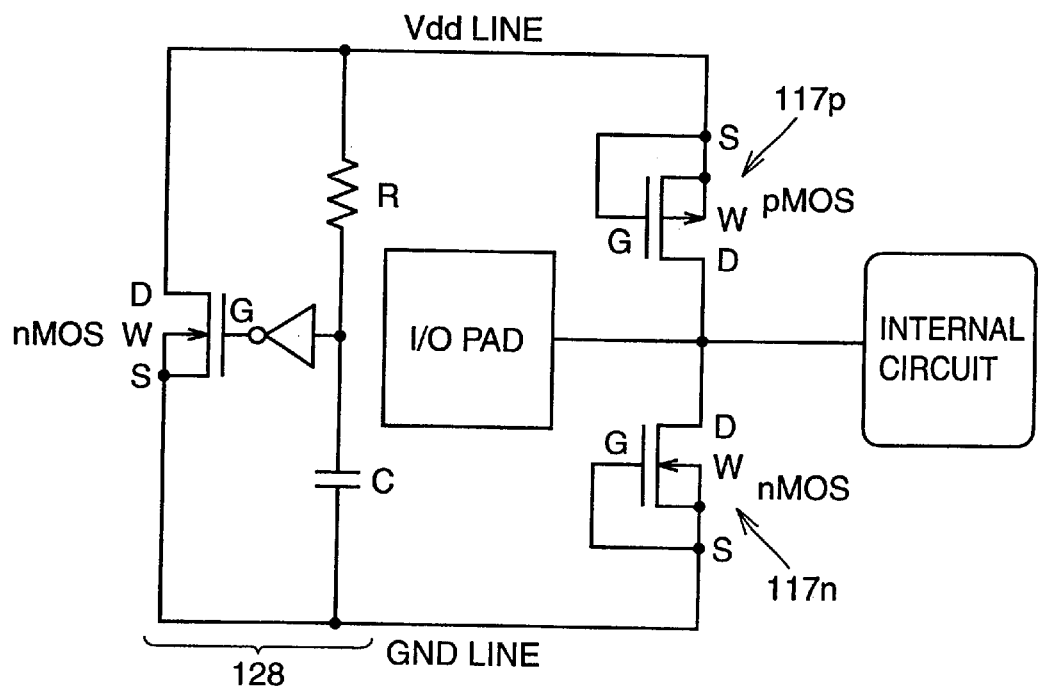
FIG. 65 shows another example of the structure of the conventional ESD protection circuit.

In FIG. 58, diode-type division circuit 47 employing the pn junction diode is arranged in the high-frequency signal I/O pad, and pMOS transistor 28 of high Vth is arranged between the Vdd line and the GND line. This embodiment differs from the seventh embodiment only in employment of the pMOS transistor of high Vth as clamp element 28. As already described, the MOS transistor of high Vth forming clamp element 28 may be of either p-type or n-type, and the same effect can be achieved independently of the type. Therefore, this embodiment can provide the silicon MOSFET semiconductor device, which does not cause a malfunction, can achieve high ESD resistance and can have good high-frequency characteristics Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:

an internal circuit including a semiconductor element;

an I/O pad forming a terminal of said internal circuit;

a division circuit connected to a lead-in line connecting said internal circuit to said I/O pad, and outputting an electric signal from first and second terminals, corresponding to an electric signal applied to said lead-in line; and a clamp circuit including an n-channel MOS transistor arranged between having a drain and a source respectively connected to said first and second terminals, a gate connected to the drain, and a p-type well connected to the source, wherein electrical conduction between said first terminal and said second terminal is cut off when a voltage difference between the electrical signal sent from said first terminal and the electrical signal sent from said second terminal side is smaller in absolute value than a threshold voltage of said MOS transistor, and electrical conduction occurs when the absolute value of the voltage difference is at least equal to the threshold voltage, thereby clamping to prevent the voltage applied to said internal circuit from exceeding a predetermined value.

2. The semiconductor device according to claim 1, wherein the threshold voltage of said n-channel MOS transistor is higher than a voltage applied in a normal operation to an external power supply line connecting said first terminal of said division circuit to an external power supply.

3. The semiconductor device according to claim 2, wherein said gate includes a p-type semiconductor.

4. The semiconductor device according to claim 1, wherein said division circuit includes two pn junction diodes, both connected to said lead-in line and arranged in a forward direction directed from said second terminal to said first terminal.

5. The semiconductor device according to claim 1, wherein said internal circuit includes a silicon MOSFET (Metal Oxide Semiconductor Field Effect Transistor).

6. The semiconductor device according to claim 5, wherein said MOS transistor of said clamp circuit contains a p-type dopant impurity in a channel portion in a concentration higher than that of a channel portion of said silicon MOSFET included in said internal circuit.

7. The semiconductor device according to claim 5, wherein said MOS transistor of said clamp circuit has a gate insulating film thicker than a gate insulating film of at least one of a plurality of silicon MOS transistors included in said internal circuit.

8. The semiconductor device according to claim 1, wherein said division circuit, said clamp circuit, and said internal circuit are located in a common silicon substrate.

9. A semiconductor device comprising:

an internal circuit including a semiconductor element;

an I/O pad as a terminal of said internal circuit;

a division circuit connected to a lead-in line connecting said internal circuit to said I/O pad, and outputting an electrical signal from first and second terminals, corresponding to an electric signal applied to said lead-in; and a clamp circuit including a p-channel MOS transistor having a drain and a source respectively connected to said first and second terminals, a gate connected to the source, and an n-type well connected to the drain, wherein electrical conduction between said first terminal and said second terminal is cut off when a voltage difference between the electrical signal sent from said first terminal and the electrical signal sent from said second terminal side is smaller in absolute value than a threshold voltage of said MOS transistor, and electrical conduction occurs when the absolute value of the voltage difference is at least equal to the threshold voltage, thereby clamping to prevent the voltage applied to said internal circuit from exceeding a predetermined value.

10. The semiconductor device according to claim 9, wherein the threshold voltage of said p-channel MOS transistor is higher in absolute value than a voltage applied in a normal operation to an external power supply line connecting said first terminal of said division circuit to an external power supply.

11. The semiconductor device according to claim 10, wherein said gate includes an n-type semiconductor.

12. The semiconductor device according to claim 9, wherein said division circuit includes two pn junction diodes, both connected to said lead-in line and arranged in a forward direction directed from said second terminal to said first terminal.

13. The semiconductor device according to claim 9, wherein said internal circuit includes a silicon MOSFET (Metal Oxide Semiconductor Field Effect Transistor).

14. The semiconductor device according to claim 13, wherein said MOS transistor of said clamp circuit contains an n-type dopant impurity in a channel portion in a concentration higher than that of a channel portion of said silicon MOSFET included in said internal circuit.

15. The semiconductor device according to claim 13, wherein said MOS transistor of said clamp circuit has a gate insulating film thicker than a gate insulating film of at least one of a plurality of silicon MOS transistors included in said internal circuit.

16. The semiconductor device according to claim 9, wherein said division circuit, said clamp circuit, and said internal circuit are located in a common silicon substrate.

17. A semiconductor device comprising:

an internal circuit including a semiconductor element;

an I/O pad as a terminal of said internal circuit;

a division circuit connected to a lead-in line connecting said internal circuit to said I/O pad, and outputting an electrical signal from first and second terminals, corresponding to an electrical signal applied to said lead-in line, wherein said division circuit includes a p-channel MOS transistor and an n-channel MOS transistor, both connected to said lead-in line, said p-channel MOS transistor has a source and a drain, one being connected to said lead-in line and the other being connected to a gate of said p-channel MOS transistor, an n-type well, and said first terminal, and said n-channel MOS transistor has a source and a drain, one being connected to said lead-in line and the other being connected to a gate of said n-channel MOS transistor, a p-type well, and said second terminal; and a clamp circuit including an MOS transistor arranged between said first and second terminals, wherein electrical conduction between said first terminal and said second terminal is cut off when a voltage difference between the electrical signal sent from said first terminal and the electrical signal sent from said second terminal side is smaller in absolute value than a threshold voltage of said MOS transistor, and electrical conduction occurs when the absolute value of the voltage difference is at least equal to the threshold voltage, thereby clamping to prevent the voltage applied to said internal circuit from exceeding a predetermined value.

18. The semiconductor device according to claim 17, wherein said p- and n-channel MOS transistors have gate widths smaller than that of said MOS transistor of said clamp circuit.

* * * * *